(12) United States Patent
Bower et al.

(10) Patent No.: US 10,782,002 B2
(45) Date of Patent: Sep. 22, 2020

(54) LED OPTICAL COMPONENTS

(71) Applicant: X Display Company Technology Limited, Dublin (IE)

(72) Inventors: Christopher Bower, Raleigh, NC (US); Matthew Meitl, Durham, NC (US); Ronald S. Cok, Rochester, NY (US); Brent Fisher, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 29 days.

(21) Appl. No.: 15/796,259

(22) Filed: Oct. 27, 2017

(65) Prior Publication Data
US 2018/0119931 A1    May 3, 2018

Related U.S. Application Data

(60) Provisional application No. 62/414,085, filed on Oct. 28, 2016.

(51) Int. Cl.
*F21V 7/04* (2006.01)
*F21V 19/00* (2006.01)
(Continued)

(52) U.S. Cl.
CPC ............ *F21V 19/0015* (2013.01); *F21V 7/04* (2013.01); *H01L 25/0753* (2013.01);
(Continued)

(58) Field of Classification Search
CPC ..... H01L 25/0753; H01L 33/58; H01L 33/60; F21V 7/04; F21V 19/0015; F21Y 2115/10; G02B 19/0061; G02B 19/0066
See application file for complete search history.

(56) References Cited

U.S. PATENT DOCUMENTS

| 4,746,202 A | 5/1988 | Perilloux et al. |
| 5,060,027 A | 10/1991 | Hart et al. |
| | (Continued) | |

FOREIGN PATENT DOCUMENTS

| CN | 103677427 A | 3/2014 |
| EP | 1662301 A1 | 5/2006 |
| | (Continued) | |

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Thien M Le
*Assistant Examiner* — April A Taylor
(74) *Attorney, Agent, or Firm* — William R. Haulbrook; Michael D. Schmitt; Choate, Hall & Stewart LLP

(57) ABSTRACT

A light-emitting diode (LED) optical component comprises a component substrate and an disposed on the component substrate. The LED emits light when provided with electrical power. An optical element is disposed at least partly in contact with the component substrate such that at least a portion of the emitted light is incident on the optical element. A second optical element can optionally be disposed between the LED and the component substrate or on a side of the component substrate opposite the LED. An LED optical system includes a system substrate on which one or more LED optical components are disposed. The system substrate can be or include one or more optical elements.

28 Claims, 16 Drawing Sheets

(51) Int. Cl.
*H01L 25/075* (2006.01)
*F21Y 113/10* (2016.01)
*F21Y 115/10* (2016.01)
*G02B 19/00* (2006.01)
*H01L 33/58* (2010.01)
*H01L 33/60* (2010.01)

(52) U.S. Cl.
CPC ........ *F21Y 2113/10* (2016.08); *F21Y 2115/10* (2016.08); *G02B 19/0061* (2013.01); *G02B 19/0066* (2013.01); *H01L 33/58* (2013.01); *H01L 33/60* (2013.01)

(56) References Cited

U.S. PATENT DOCUMENTS

| | | | |
|---|---|---|---|
| 5,550,066 | A | 8/1996 | Tang et al. |
| 5,621,555 | A | 4/1997 | Park |
| 5,625,202 | A | 4/1997 | Chai |
| 5,748,161 | A | 5/1998 | Lebby et al. |
| 5,815,303 | A | 9/1998 | Berlin |
| 5,994,722 | A | 11/1999 | Averbeck et al. |
| 6,025,730 | A | 2/2000 | Akram et al. |
| 6,084,579 | A | 7/2000 | Hirano |
| 6,087,680 | A | 7/2000 | Gramann et al. |
| 6,142,358 | A | 11/2000 | Cohn et al. |
| 6,143,672 | A | 11/2000 | Ngo et al. |
| 6,169,294 | B1 | 1/2001 | Biing-Jye et al. |
| 6,184,477 | B1 | 2/2001 | Tanahashi |
| 6,278,242 | B1 | 8/2001 | Cok et al. |
| 6,288,824 | B1 | 9/2001 | Kastalsky |
| 6,340,999 | B1 | 1/2002 | Masuda et al. |
| 6,392,340 | B2 | 5/2002 | Yoneda et al. |
| 6,403,985 | B1 | 6/2002 | Fan et al. |
| 6,410,942 | B1 | 6/2002 | Thibeault et al. |
| 6,466,281 | B1 | 10/2002 | Huang et al. |
| 6,504,180 | B1 | 1/2003 | Heremans et al. |
| 6,577,367 | B2 | 6/2003 | Kim |
| 6,650,382 | B1 | 11/2003 | Sumida et al. |
| 6,660,457 | B1 | 12/2003 | Imai et al. |
| 6,703,780 | B2 | 3/2004 | Shiang et al. |
| 6,717,560 | B2 | 4/2004 | Cok et al. |
| 6,756,576 | B1 | 6/2004 | McElroy et al. |
| 6,812,637 | B2 | 11/2004 | Cok et al. |
| 6,828,724 | B2 | 12/2004 | Burroughes |
| 6,933,532 | B2 | 8/2005 | Arnold et al. |
| 6,969,624 | B2 | 11/2005 | Iwafuchi et al. |
| 6,975,369 | B1 | 12/2005 | Burkholder |
| 7,009,220 | B2 | 3/2006 | Oohata |
| 7,012,382 | B2 | 3/2006 | Cheang et al. |
| 7,091,523 | B2 | 8/2006 | Cok et al. |
| 7,098,589 | B2 | 8/2006 | Erchak et al. |
| 7,127,810 | B2 | 10/2006 | Kasuga et al. |
| 7,129,457 | B2 | 10/2006 | McElroy et al. |
| 7,195,733 | B2 | 3/2007 | Rogers et al. |
| 7,259,391 | B2 | 8/2007 | Liu et al. |
| 7,288,753 | B2 | 10/2007 | Cok |
| 7,329,905 | B2 | 2/2008 | Ibbetson et al. |
| 7,354,801 | B2 | 4/2008 | Sugiyama et al. |
| 7,402,951 | B2 | 7/2008 | Cok |
| 7,417,648 | B2 | 8/2008 | Credelle |
| 7,420,221 | B2 | 9/2008 | Nagai |
| 7,466,075 | B2 | 12/2008 | Cok et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,605,053 | B2 | 10/2009 | Couillard et al. |
| 7,614,757 | B2 | 11/2009 | Nesterenko et al. |
| 7,622,367 | B1 | 11/2009 | Nuzzo et al. |
| 7,629,955 | B2 | 12/2009 | Asao et al. |
| 7,662,545 | B2 | 2/2010 | Nuzzo et al. |
| 7,687,812 | B2 | 3/2010 | Louwsma et al. |
| 7,704,684 | B2 | 4/2010 | Rogers et al. |
| 7,791,271 | B2 | 9/2010 | Cok et al. |
| 7,799,699 | B2 | 9/2010 | Nuzzo et al. |
| 7,816,856 | B2 | 10/2010 | Cok et al. |
| 7,834,541 | B2 | 11/2010 | Cok |
| 7,872,722 | B2 | 1/2011 | Kimura |
| 7,893,612 | B2 | 2/2011 | Cok |
| 7,898,734 | B2 | 3/2011 | Coleman et al. |
| 7,919,342 | B2 | 4/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,948,172 | B2 | 5/2011 | Cok et al. |
| 7,969,085 | B2 | 6/2011 | Cok |
| 7,972,875 | B2 | 7/2011 | Rogers et al. |
| 7,982,296 | B2 | 7/2011 | Nuzzo et al. |
| 7,990,058 | B2 | 8/2011 | Cok et al. |
| 7,999,454 | B2 | 8/2011 | Winters et al. |
| 8,004,758 | B2 | 8/2011 | Coleman et al. |
| 8,029,139 | B2 | 10/2011 | Ellinger et al. |
| 8,039,847 | B2 | 10/2011 | Nuzzo et al. |
| 8,058,663 | B2 | 11/2011 | Fan et al. |
| 8,198,621 | B2 | 6/2012 | Rogers et al. |
| 8,207,547 | B2 | 6/2012 | Lin |
| 8,243,027 | B2 | 8/2012 | Hotelling et al. |
| 8,261,660 | B2 | 9/2012 | Menard |
| 8,288,843 | B2 | 10/2012 | Kojima et al. |
| 8,294,182 | B2 | 10/2012 | Jeong |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,450,927 | B2 | 5/2013 | Lenk et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,536,584 | B2 | 9/2013 | Yao |
| 8,558,243 | B2 | 10/2013 | Bibl et al. |
| 8,581,827 | B2 | 11/2013 | Park et al. |
| 8,596,846 | B2 | 12/2013 | Yankov et al. |
| 8,619,011 | B2 | 12/2013 | Kimura |
| 8,629,471 | B2 | 1/2014 | Kim et al. |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,735,932 | B2 | 5/2014 | Kim et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,829,663 | B2 | 9/2014 | Pohl et al. |
| 8,835,940 | B2 | 9/2014 | Hu et al. |
| 8,836,624 | B2 | 9/2014 | Roberts et al. |
| 8,854,294 | B2 | 10/2014 | Sakariya |
| 8,860,051 | B2 | 10/2014 | Fellows et al. |
| 8,865,489 | B2 | 10/2014 | Rogers et al. |
| 8,877,648 | B2 | 11/2014 | Bower et al. |
| 8,884,844 | B2 | 11/2014 | Yang et al. |
| 8,889,485 | B2 | 11/2014 | Bower |
| 8,895,406 | B2 | 11/2014 | Rogers et al. |
| 8,901,578 | B2 | 12/2014 | Kobayakawa et al. |
| 8,902,152 | B2 | 12/2014 | Bai et al. |
| 8,912,020 | B2 | 12/2014 | Bedell et al. |
| 8,941,215 | B2 | 1/2015 | Hu et al. |
| 8,946,760 | B2 | 2/2015 | Kim |
| 8,987,765 | B2 | 3/2015 | Bibl et al. |
| 9,022,632 | B2 | 5/2015 | Kim et al. |
| 9,048,449 | B2 | 6/2015 | Kim et al. |
| 9,105,714 | B2 | 8/2015 | Hu et al. |
| 9,105,813 | B1 | 8/2015 | Chang |
| 9,111,464 | B2 | 8/2015 | Bibl et al. |
| 9,153,171 | B2 | 10/2015 | Sakariya et al. |
| 9,161,448 | B2 | 10/2015 | Menard et al. |
| 9,166,114 | B2 | 10/2015 | Hu et al. |
| 9,178,123 | B2 | 11/2015 | Sakariya et al. |
| 9,202,996 | B2 | 12/2015 | Orsley et al. |
| 9,217,541 | B2 | 12/2015 | Bathurst et al. |
| 9,226,361 | B2 | 12/2015 | Toth |
| 9,240,397 | B2 | 1/2016 | Bibl et al. |
| 9,252,375 | B2 | 2/2016 | Bibl et al. |
| 9,277,618 | B2 | 3/2016 | Odnoblyudov et al. |

(56) References Cited

U.S. PATENT DOCUMENTS

| | | |
|---|---|---|
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,362,348 B2 | 6/2016 | Lowenthal et al. |
| 9,367,094 B2 | 6/2016 | Bibl et al. |
| 9,368,683 B1 | 6/2016 | Meitl et al. |
| 9,412,727 B2 | 8/2016 | Menard et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,626,908 B2 | 4/2017 | Sakariya et al. |
| 9,634,191 B2 | 4/2017 | Keller et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,761,754 B2 | 9/2017 | Bower et al. |
| 9,765,934 B2 | 9/2017 | Rogers et al. |
| 9,818,725 B2 | 11/2017 | Bower et al. |
| 9,847,047 B2 | 12/2017 | Wu et al. |
| 9,860,955 B2 | 1/2018 | Kim et al. |
| 9,865,832 B2 | 1/2018 | Bibl et al. |
| 9,871,345 B2 | 1/2018 | Bower et al. |
| 9,929,053 B2 | 3/2018 | Bower et al. |
| 9,991,163 B2 | 6/2018 | Bower et al. |
| 9,991,423 B2 | 6/2018 | Bower et al. |
| 2001/0022564 A1 | 9/2001 | Youngquist et al. |
| 2002/0096994 A1 | 7/2002 | Iwafuchi et al. |
| 2003/0001165 A1 | 1/2003 | Taki |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0220459 A1* | 9/2010 | Jagt .......................... H01L 33/44 362/19 |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0126229 A1 | 5/2012 | Bower |
| 2012/0141799 A1 | 6/2012 | Kub et al. |
| 2012/0193652 A1 | 8/2012 | Horng et al. |
| 2012/0206428 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1 | 12/2012 | Rogers et al. |
| 2012/0326175 A1 | 12/2012 | Hu et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0087822 A1* | 4/2013 | Kim .......................... H01L 33/54 257/98 |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084240 A1 | 3/2014 | Hu et al. |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1 | 6/2014 | Smirnov et al. |
| 2014/0159043 A1 | 6/2014 | Sakariya et al. |
| 2014/0159065 A1 | 6/2014 | Hu et al. |
| 2014/0159066 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |

(56) References Cited

U.S. PATENT DOCUMENTS

| | | |
|---|---|---|
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372053 A1* | 12/2015 | Bower ............... G09G 3/32 257/89 |
| 2015/0372187 A1 | 12/2015 | Bower et al. |
| 2016/0004123 A1 | 1/2016 | Tanabe |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0364030 A1 | 12/2016 | Peana et al. |
| 2017/0025075 A1 | 1/2017 | Cok et al. |
| 2017/0025484 A1 | 1/2017 | Forrest et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1* | 5/2017 | Cok ............... G02B 5/0242 |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1* | 8/2017 | Bower ............... H01L 33/46 |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0041005 A1 | 2/2018 | Bower et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applications, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640×480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

(56) References Cited

OTHER PUBLICATIONS

Trindade, A.J. et al., Precision transfer printing of ultra-thin AlInGaN micron-size light-emitting diodes, Crown, pp. 217-218, (2012).

* cited by examiner

LED OPTICAL COMPONENTS

PRIORITY APPLICATION

This application claims the benefit of U.S. Provisional Patent Application No. 62/414,085, filed Oct. 28, 2016, titled "LED Optical Component," the content of which is incorporated by reference herein in its entirety.

FIELD OF THE INVENTION

The present invention relates to optical components incorporating micro-transfer printed micro-scale light-emitting diodes (LEDs).

BACKGROUND OF THE INVENTION

Light-emitting diodes (LEDs) are commonly used as indicators, light sources, and in large-size, outdoor displays. Because LEDs typically use semiconductor structures having a large optical index, optical structures are frequently employed to avoid trapping light in the semiconductor materials. LEDs are also often used in conjunction with optical elements such as lenses, reflectors, or light pipes. However, prior designs use relatively large LEDs and optical elements and assembly methods that are not suitable for micro-scale devices and components.

There is a need, therefore, for devices, systems and methods for integrating optical components with micro-scale light-emitting diodes.

SUMMARY OF THE INVENTION

Embodiments of the present invention provide a light-emitting diode (LED) optical component comprising a component substrate having an LED side and an opposite side opposing the LED side. In some embodiments, the LED optical component includes a broken component tether. In certain embodiments, an LED structure has an LED and a broken LED tether and an optional LED substrate separate from the component substrate. An LED structure is disposed on or adjacent to the LED side of the component substrate and the LED emits light from the LED when provided with electrical power. An optical element is disposed and is at least partly in contact with the component substrate such that the emitted light is incident on the optical element.

The optical element can be, but is not limited to, one or more refractive lenses, a dichroic filter, a color filter, a reflector, a diffuser, a polarizer, a wire-grid polarizer, a diffraction grating, or a diffractor. The optical element can be a reflective element located on the LED side, with the LED located between a portion of the optical element and the LED side of the component substrate. A reflector can be disposed between the LED and the LED side. The reflective optical element can be or have a section that is substantially parabolic, substantially spherical, substantially ellipsoidal, or form a polygon with the component substrate.

In some embodiments, the reflective optical element is a first optical element and a second optical element is disposed between the LED and the component substrate or on the opposite side of the component substrate. The second optical element can be but is not limited to one or more refractive lenses, a dichroic filter, a color filter, a reflector, a diffuser, a polarizer, a wire-grid polarizer, a diffraction grating, or a diffractor.

The first optical element, or the second optical element, can be disposed between the LED and the component substrate, disposed on the opposite side of the component substrate, or disposed on the LED side of the component substrate between the LED and the component substrate.

In some embodiments, an optical structure includes the optical element and the component substrate so that the optical element is integrated into or is a part of the component substrate, or vice versa, or the component substrate is an optical element, is a portion of an optical element, or includes an optical element. The optical element can be formed of common materials and made in a common step with the component substrate. A monolithic optical structure can include the component substrate and the optical element and the optical element can be adjacent to or in contact with the component substrate.

In some embodiments, the LED side is non-planar and includes a pedestal portion and a non-pedestal portion and the LED is disposed on the pedestal portion. In some of those embodiments, the optical element can be located on the LED side, with the LED located between a portion of the optical element and the LED side, and the optical element extends onto the non-pedestal portion.

The optical element can have a focal point, the LED can have a light-emitting volume or area over the component substrate, and the light-emitting area can be located at least partially at the focal point. The optical component can emit collimated light, light having a Lambertian distribution, or light that focuses to a volume smaller than the LED or a light-emitting volume of the LED.

At least one of the length, width, and depth of the LED can be less than or equal to one micron, two microns, three microns, five microns, ten microns, twenty microns, fifty microns, or one hundred microns. The LED can have a light-emitting area over the component substrate and the optical element can have an extent over the component substrate that is at least three times greater, five times greater, ten times greater, twenty times greater, or fifty times greater than the light-emitting area of the LED over the component substrate.

The LED can be a first LED that emits a first color of light and the LED optical component can include a second LED that emits a second color of light different from the first color. In some embodiments, light emitted from different LEDs is incident on the same or different optical elements. The optical element can have an extent over the substrate that is at least three times greater, five times greater, ten times greater, twenty times greater, or fifty times greater than the extent of light emitted from the first LED and from the second LED. In some embodiments, the LED optical component includes a third LED that emits a third color of light different from the first color and different from the second color. The optical element can have an extent over the substrate that is at least three times greater, five times greater, ten times greater, twenty times greater, or fifty times greater than the extent of light emitted from the first, second, and third LEDs.

In some embodiments, the optical element is a first optical element disposed such that the emitted light is incident on the first optical element and the LED optical component includes a second optical element disposed at least partly in contact with the component substrate such that the emitted light is incident on the optical element.

The LED optical system can include a system substrate on which one or more LED optical components are disposed. The system substrate can be an optical element that redirects light emitted into or onto the system substrate. Alternatively, or in addition, the system substrate can include an optical element that can be disposed on the system substrate and can redirect light emitted into or onto the optical element. The LED structures can be electrically interconnected on the component substrate with fine-resolution electrical connections and the component substrates can be electrically interconnected on the system substrate with coarse-resolution electrical connections.

In some embodiments of the present invention, a light-emitting diode (LED) optical component includes an optical element comprising an optical substrate with an optical extent and an optical area. An LED structure of the LED optical component comprises a broken LED tether and an optional LED substrate separate from the optical substrate. The LED structure is disposed on a component substrate and the LED emits light into or onto the optical element when provided with electrical power. The LED structure has an LED extent and a light-emitting area over the component substrate. The optical extent can be at least one thousand, five thousand, ten thousand, fifty thousand, one hundred thousand, five hundred thousand, or one million times the LED extent. The optical area can be at least one hundred thousand, five hundred thousand, one million, five million, ten million, or fifty million times the LED light-emitting area.

Certain embodiments of the present invention provide micro-scale optical components useful in applications requiring very small sizes, for example in medical or display applications. Because the emission area of the light emitters is relatively small compared to the optical elements, light emitted from the LED optical component can have a reduced divergence angle. In certain embodiments, additional optical components are very small with well-defined structures and well-behaved light emission that complement the optical elements.

In one aspect, the disclosed technology includes a light-emitting diode (LED) optical component, comprising: a component substrate having an LED side; an LED structure disposed on, or adjacent to, the LED side of the component substrate, wherein (i) the LED structure comprises an LED and a broken or separated LED tether and (ii) the LED emits light from the LED when provided with electrical power; and an optical element disposed at least partly in contact with the component substrate such that at least a portion of the emitted light is incident on the optical element.

In certain embodiments, the LED structure comprises an LED substrate separate, distinct, and independent of the component substrate and the LED.

In certain embodiments, the optical element comprises at least one of one or more refractive lenses, a dichroic filter, a color filter, a reflector, a diffuser, polarizer, a wire-grid polarizer, a diffraction grating, and a diffractor.

In certain embodiments, the optical element is a reflective element located on the LED side and the LED is disposed between a portion of the optical element and the LED side.

In certain embodiments, the LED optical component comprises a reflector between the LED and the LED side.

In certain embodiments, the reflective optical element is substantially parabolic, substantially spherical, or forms a polygon with the component substrate.

In certain embodiments, the optical element is a first optical element and the LED optical component comprises a second optical element disposed between the LED and the component substrate or on a side of the component substrate opposite the LED.

In certain embodiments, the second optical element comprises at least one or more of one or more refractive lenses, a dichroic filter, a color filter, a reflector, a diffuser, polarizer, a wire-grid polarizer, a diffraction grating, and a diffractor.

In certain embodiments, the optical element is disposed on the LED side of the component substrate between the LED and the component substrate, the optical element is disposed on a side of the component substrate opposite the LED, or the LED is disposed at least partially between the optical element and the component substrate.

In certain embodiments, the optical element is integrated in, is integral with, or is a part of the component substrate or wherein the component substrate is an optical element, is a portion of an optical element, or includes an optical element.

In certain embodiments, the LED side of the component substrate is non-planar, the component substrate comprises a pedestal portion and a non-pedestal portion on the LED side, and the LED is disposed on the pedestal portion.

In certain embodiments, the optical element is disposed on the LED side, with the LED located between a portion of the optical element and the LED side, and wherein the optical element extends onto the non-pedestal portion.

In certain embodiments, the optical element has a focal point, the LED has a light-emitting area, and a least a portion of the light-emitting area, the LED, or the LED structure is located at the focal point.

In certain embodiments, the LED optical component emits at least one of collimated light, light having a Lambertian distribution, light that focuses to a volume smaller than the LED, and light that focuses to a volume smaller than a light-emitting volume of the LED.

In certain embodiments, at least one of the length, width, or depth of the LED is less than or equal to one micron, two microns, three microns, five microns, ten microns, twenty microns, fifty microns, one hundred microns, or two hundred microns.

In certain embodiments, the LED has a light-emitting area and the optical element has an extent over the component substrate that is at least three times greater, five times greater, ten times greater, twenty times greater, or fifty times greater than the light-emitting area of the LED, the LED itself, or the LED structure.

In certain embodiments, the LED is a first LED that emits light of a first color and comprising a second LED that emits a light of a second color, wherein the second color of light is different from the first color of light.

In certain embodiments, the LED component includes a third LED that emits light of a third color, wherein the third color is different from the first color and different from the second color.

In certain embodiments, the optical element has an extent over the component substrate that is at least three times greater, five times greater, ten times greater, twenty times greater, or fifty times greater than the extent of light emitted from the first LED and from the second LED.

In certain embodiments, the optical element is a first optical element disposed such that at least a portion of the emitted light from the first LED is incident on the first optical element and the LED optical component comprises a second optical element disposed at least partly in contact with the component substrate such that at least a portion of the emitted light from the second LED is incident on the second optical element.

In certain embodiments, the first optical element of the first LED is different from the second optical element of the second LED.

In certain embodiments, the component substrate comprises at least one or more of a broken or separated component tether, the LED structure comprises a broken or separated structure tether, and the optical element comprises a broken or separated element tether.

In certain embodiments, the LED is a micro-LED having one or more of a length of no more than 200 microns, 100 microns, 50, microns, or 20 microns and a width of no more than 200 microns, 100 microns, 50, microns, or 20 microns.

In another aspect, the disclosed technology includes an LED optical system. In certain embodiments, the LED optical system includes a system substrate on which one or more LED optical components are disposed.

In certain embodiments, each LED optical component includes a component substrate having an LED side and an LED structure separate from the component substrate and disposed on, or adjacent to, the LED side of the component substrate. The LED structure comprises an LED and a broken or separated LED tether and the LED emits light from the LED when provided with electrical power. An optical element is disposed and at least partly in contact with the component substrate such that the emitted light is incident on the optical element.

In certain embodiments, at least one of (i) the component substrate comprises a broken or separated component tether, (ii) the LED structure comprises a broken or separated structure tether, and (iii) the optical element comprises a broken or separated element tether.

In certain embodiments, the system substrate is an optical element that redirects light incident on the system substrate.

In certain embodiments, the system comprises an optical element disposed on the system substrate that redirects light incident on the optical element.

In certain embodiments, the LED structures are electrically interconnected on the component substrate with fine-resolution electrical connections for each of the one or more LED optical components and each component substrate of the one or more LED optical components is electrically interconnected on the system substrate with coarse-resolution electrical connections.

In certain embodiment, at least one or more of the component substrate of at least one of the one or more LED optical components comprises a broken or separated component tether, the LED structure comprises a broken or separated structure tether, and the optical element comprises a broken or separated element tether.

In certain embodiments, the LED of each of the one or more LED optical components is a micro-LED having one or more of a length of no more than 200 microns, 100 microns, 50, microns, or 20 microns and a width of no more than 200 microns, 100 microns, 50, microns, or 20 microns.

In another aspect, the disclosed technology includes a light-emitting diode (LED) optical component, including: an optical structure, the optical structure comprising a component substrate and an optical element having an optical extent and an optical area; and an LED structure comprising a broken or separated LED tether and an LED that is separate from the optical element, wherein (i) the LED structure is disposed on the component substrate, (ii) the LED emits light when provided with electrical power such that at least a portion of the emitted light is incident on the optical element, and (iii) the LED structure has an LED extent and an LED light-emitting area over the component substrate, wherein at least one of (i) the optical extent is at least one thousand, five thousand, ten thousand, fifty thousand, one hundred thousand, five hundred thousand, or one million times the LED extent and (ii) the optical area is at least one hundred thousand, five hundred thousand, one million, five million, ten million, or fifty million times the LED light-emitting area.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
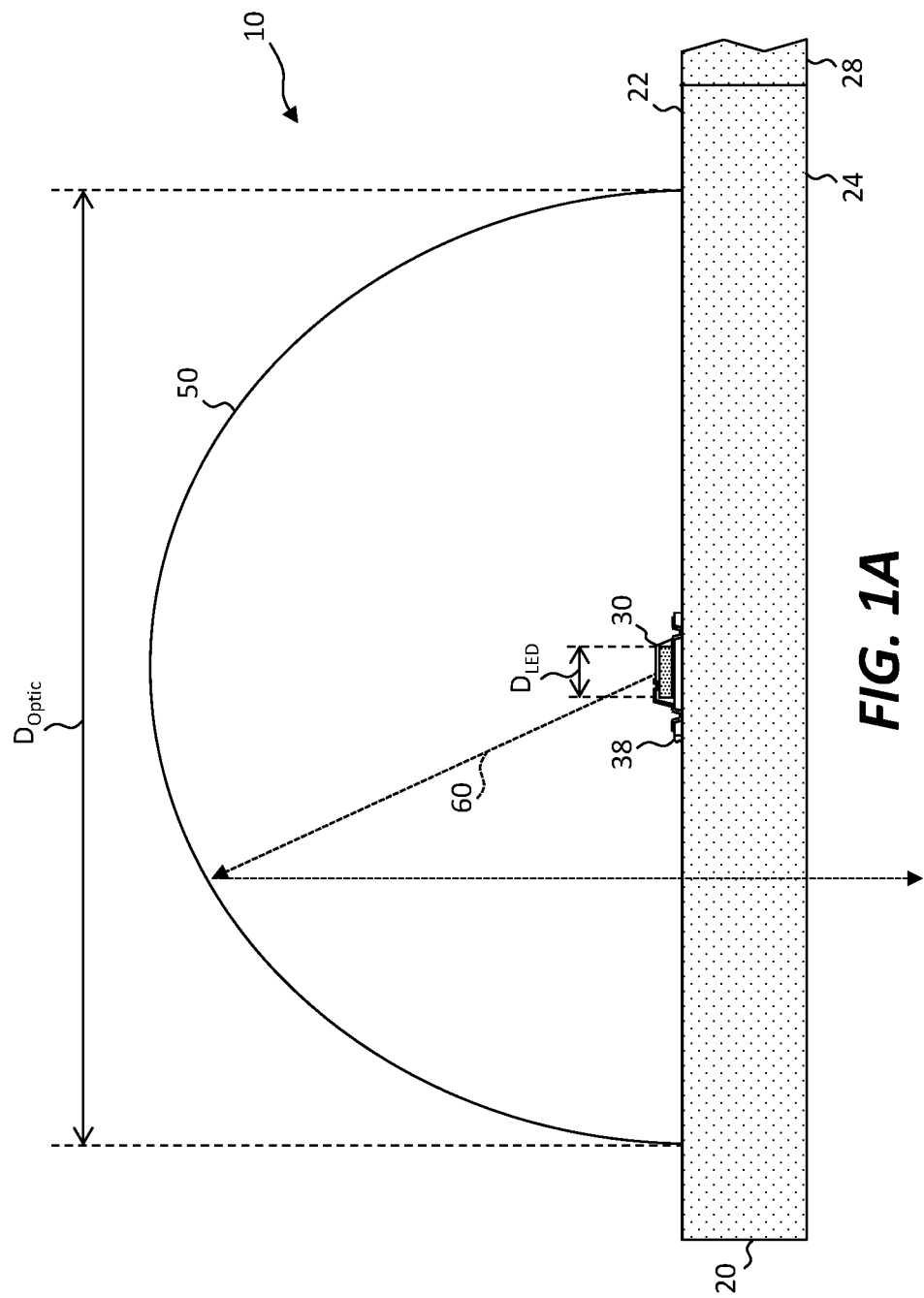
FIG. 1A is a cross section of an LED optical component that includes a top-emitting LED structure disposed on a component substrate and a reflective optical element distinct from the component substrate, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
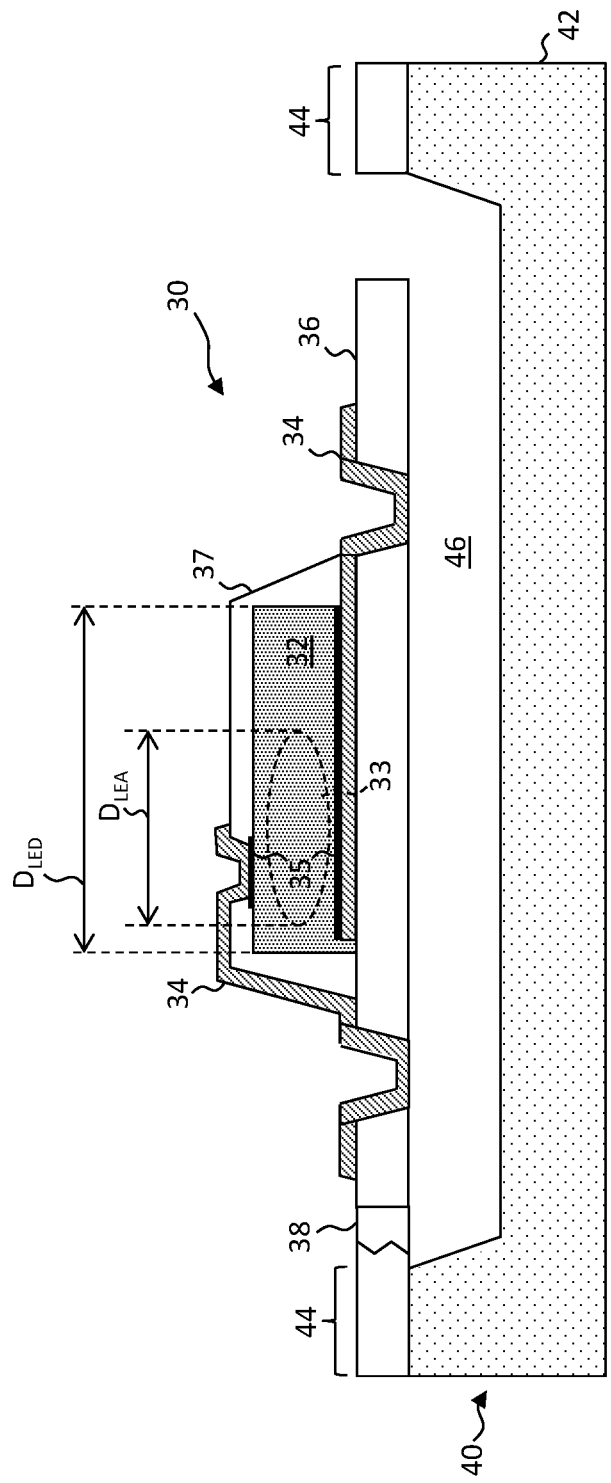
FIG. 2 is a detailed cross section of an LED structure on an LED source wafer, according to illustrative embodiments of the present invention (e.g., that is used in the optical component shown in FIG. 1A)

Embodiments of the present invention include a light-emitting diode (LED or micro-LED) optical component 10 comprising one or more LEDS or micro-LEDs 32 and an optical element 50, as shown in the illustration of FIG. 1A and the detail cross section of FIG. 2. The micro-LED 32 shown in FIG. 2 is on or part of an LED source wafer 40 and can be disposed on an LED optical component 10 (e.g., the LED optical component 10 shown in FIG. 1A) by transfer printing (e.g., micro-transfer printing). A light-emitting volume 33 of each of one or more micro-LEDs 32 can be very small compared to the size or extent of an optical element 50. Thus, in some embodiments, some, all, or a substantial portion of light emission of a micro-LED 32 can be located within, or very near, a focal point, area, or volume of the optical element 50, thereby improving the efficiency of the LED optical component 10. Without wishing to be bound by any particular theory, because physical optical elements are never ideal, the focal "point" of an actual optical element 10 is typically a volume or area. In some embodiments, a substantial portion of light emission of an LED 32 (e.g., a micro-LED), for example 5%, 10%, 20%, 30%, 50%, 70%, 80%, 90%, or 95%, is within the focal point, focal area, or focal volume of an optical element 50. In some embodiments, a substantial portion of light emission, for example 30%, 50%, 70%, 80%, 90%, or 95%, is within one micron, two microns, five microns, ten microns, twenty microns, fifty microns, or one hundred microns of a focal point, focal area, or focal volume of the optical element 50.

Figure 13:
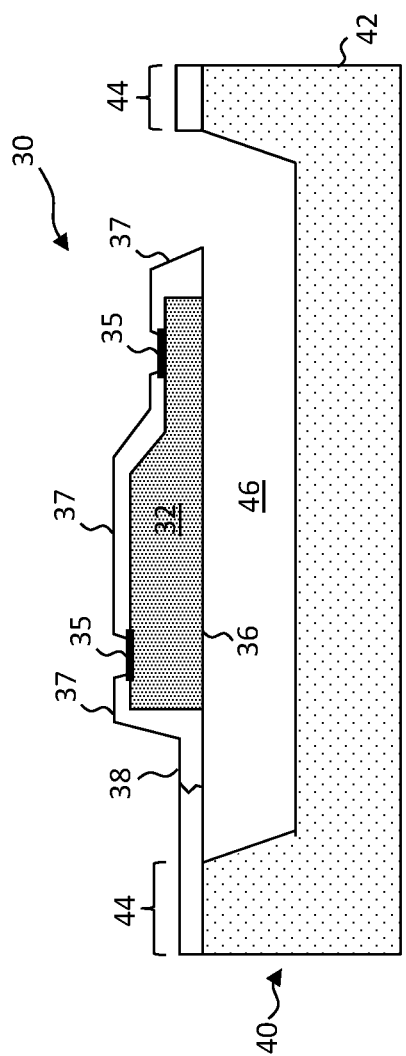
FIG. 13 is a detailed cross section of an LED structure attached to an LED source wafer, according to illustrative embodiments of the present invention.

Referring to the cross sections of FIGS. 1A-1C, 2, and 13, in some embodiments of the present invention a light-emitting diode (LED) optical component 10 comprises a component substrate 20 having an LED side 22 and an opposite side 24 opposing the LED side 22 (as shown in FIG. 1A). The optical component 10 comprises an LED structure 30 separate from the component substrate 20. In some embodiments, the LED structure 30 comprises an LED 32 and a broken or separated LED tether 38 physically connected to or a part of the LED 32. The LED structure 30 can be separate, distinct, and independent from the component substrate 20. The LED 32 can be a semiconductor structure. The LED structure 30 can also optionally comprise an LED substrate 36 separate, distinct, and independent of the LED 32 and component substrate 20 (as shown in FIG. 2). In some embodiments, the LED substrate 36 can be absent (as shown in FIG. 13), integral to the LED 32, or a portion of the LED 32. By integral, it is meant that the elements (e.g., LED 32 and LED substrate 36) form a single integrated structure or are made of the same materials or formed in a common unit.

The LED structure 30 is disposed on or adjacent to the LED side 22 of the component substrate 20 and the LED 32 emits light 60 from the LED 32 when provided with electrical power, for example as illustrated with the dashed arrow in FIG. 1A. An optical element 50 is disposed at least partly in contact with a component substrate 20 such that the emitted light is incident on the optical element 50 (e.g., as seen by the dashed arrow originating from an LED 32 of LED structure 30 in FIG. 1A). In certain embodiments, an optical element 50 can redirect the light 60 after the light 60 is emitted from an LED 32 of an LED structure 30 (as shown in FIG. 1A). As used herein, emitted light "is incident on" an optical element means that emitted photons from the LED are incident such that they impinge, strike, are intercepted by, pass through, are absorbed by, and/or are reflected from the optical element. Accordingly, an optical element disposed such that emitted light from an LED (e.g., a micro-LED) is incident on the optical element means that the optical element is disposed such that when light is emitted by the LED, the path that at least a portion of the emitted light takes intersects the optical element as the light propagates from the LED.

Figure 1B:
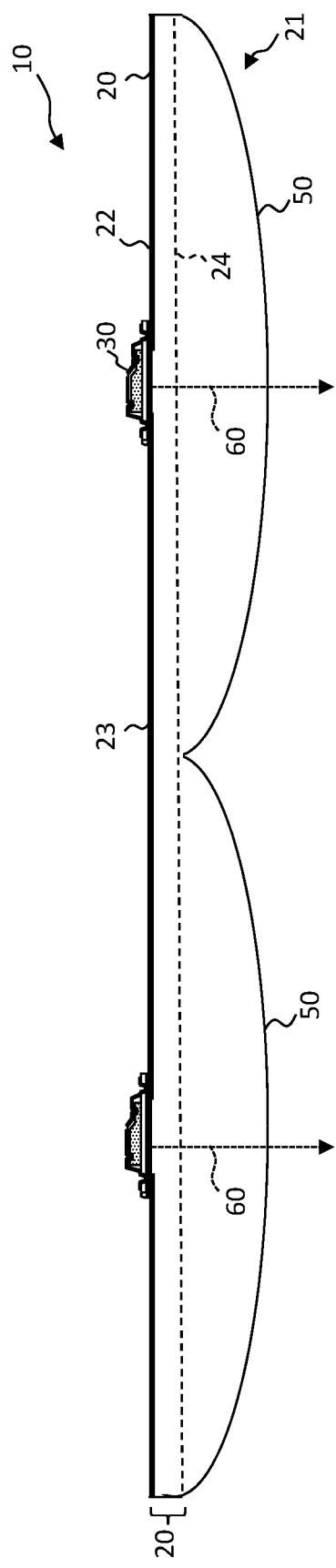
FIG. 1B is a cross section of an LED optical component that includes two bottom-emitting LED structures disposed on a component substrate integral with a refractive optical element and having a planar surface on which the LED structures are disposed, according to illustrative embodiments of the present invention.
Figure 1C:
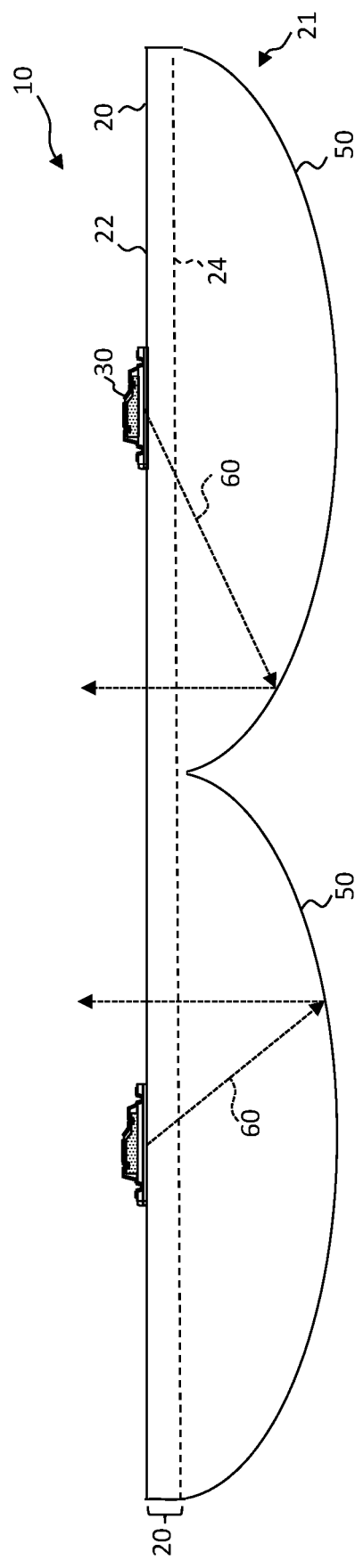
FIG. 1C is a cross section of an LED optical component that includes two bottom-emitting LED structures disposed on a component substrate integral with a reflective optical element and having a planar surface on which the LED structures are disposed, according to illustrative embodiments of the present invention.

In some embodiments, a component substrate 20 is a micro-transfer printed component comprising a broken component tether 28 separate and distinct from the LED tether 38 (as shown in FIG. 1A). In some embodiments, a component substrate 20 is a portion of an optical structure 21 that comprises the optical element 50 and the component substrate 20. Thus, in some embodiments, a component substrate 20 is integral with an optical element 50, for example as a part of an optical structure 21 having a planar portion opposite a light-refractive optical element 50 (as shown in FIG. 1B) or light-reflective optical element 50 (as shown in FIG. 1C). In such cases, the opposite side 24 of a component substrate 20 can be a virtual side (as shown by dashed lines in FIGS. 1B and 1C) or can be the side in contact with or adjacent to the optical element 50. In some embodiments, a component substrate 20 is formed in a common step with an optical element 50 using common materials, for example by molding an optical structure 21 that has a non-planar surface defining an optical element 50 opposing a planar surface (e.g., the LED side 22) that is part of or defines a component substrate 20 and on which an LED structure 30 can be disposed or mounted, for example, by micro-transfer printing. Thus, a component substrate 20 and an optical element 50 can be separate elements (as shown in FIG. 1A) or part of a common optical structure 21 (as shown in FIGS. 1B, 1C). In either case, the optical element 50 is at least partly in contact with the component substrate 20, even if both are integral to a common optical structure 21. A planar portion of a component substrate 20 can comprise reflectors or reflective portions and can comprise electrical conductors such as wires formed or disposed on or in the LED side 22 so that the component substrate 20 can conduct electricity to the LED structure 30 from an external power or control signal device (not shown).

An optical element 50 can be formed on or over an LED structure 30 (e.g., a micro-transfer printed LED structure) and component substrate 20, for example by coating and molding optical materials, such as a substantially (e.g., greater than 50%, 70%, 90%, or 95%) transparent curable resin over the LED structure 30 and component substrate 20 (FIG. 1A). In some embodiments, an optical structure 21 can be first molded to form an optical element 50 and a component substrate 20 with a planar surface onto which an LED structure 30 is subsequently disposed (e.g., micro-transfer printed onto) (as shown in FIGS. 1B, 1C).

Figure 5:
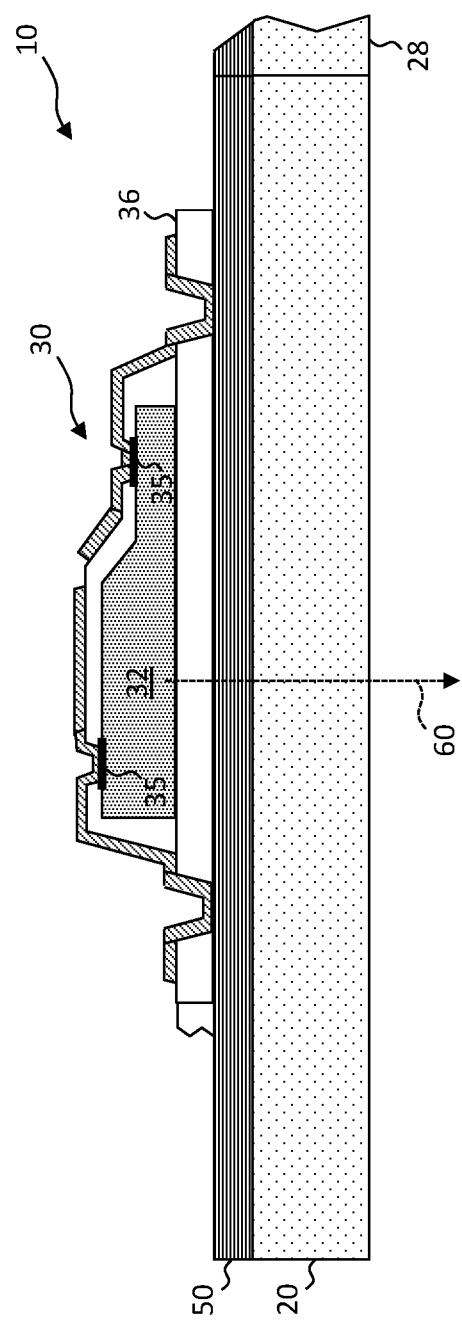
FIG. 5 is a cross section of an LED optical component comprising a bottom-emitting LED structure and a dichroic filter optical element disposed between the LED structure and the component substrate, according to illustrative embodiments of the present invention.

An LED 32 or LED structure 30 can be disposed at least partially between an optical element 50 and a component substrate 20 (as shown in FIG. 1A). In some embodiments, an optical element 50 is disposed on an opposite side 24 of a component substrate 20 that is opposite an LED side 22 of the component substrate 20 on or over which an LED structure 30 comprising LED 32 is disposed (as shown in FIGS. 1B, 1C). In some embodiments, an optical element 50 is disposed on an LED side 22 of a component substrate 20 between an LED structure 30 comprising an LED 32 and the component substrate 20 (as shown in FIG. 5 and described further below).

Referring to FIG. 2, an LED structure 30 can be provided on an LED source wafer 40 and transfer printed (e.g., micro-transfer printed) to a component substrate 20 using a transfer printing stamp (e.g., micro-transfer printing stamp). As shown in FIG. 2, an LED source wafer 40 comprises an LED source substrate 42, for example, patterned with a sacrificial layer 46 that, when sacrificed (e.g., by etching) forms a gap 46 so that one or more LED structures 30 disposed thereon are each attached to one or more anchors 44 with one or more LED tethers 38, wherein the one or more anchors 44 can be portions of the LED source substrate 42. An LED source substrate 42 can comprise, for example, at least one of glass, plastic, a semiconductor, a compound semiconductor, or sapphire. A functional structure is formed or disposed over each sacrificial layer 46, for example, an LED structure 30 comprising an LED 32 (as shown in FIG. 13) or an integrated circuit. In some embodiments and as shown in FIG. 2, an LED structure 30 comprises an LED substrate 36 on which a bottom electrode 34 is formed and an LED 32 disposed over the bottom electrode 34. In some embodiments, an LED tether 38 is a portion of the LED substrate 36, a portion of the LED 32, or a portion of an LED encapsulating layer (e.g., dielectric layer 37). A bottom electrode 34 can be reflective. A bottom electrode can comprise, for example, a metal, or transparent material, such as a transparent conductive oxide or doped semiconductor. A bottom electrode 34 can comprise an LED contact pad 35 or a separate LED contact pad 35 structure can be provided to provide electrical contact to an LED 32. A protective dielectric layer 37 can be disposed over otherwise exposed surfaces and edges of an LED 32 and patterned to form vias through which a top electrode 34 can be electrically connected to an LED contact pad 35 to provide electrical contact to the LED 32. Referring to FIG. 13, in which no separate LED substrate 36 is present, an LED 32 is formed or disposed directly on a sacrificial layer 46 and a protective dielectric layer 37 forms an LED tether 38 that physically connects the LED 32 to LED source substrate 42. LED contact pads 35 can be designated portions of an LED 32. An LED substrate 36 can be patterned to form vias through which electrodes 34 can be patterned to provide electrical contacts to the LED structure 30 that comprises the LED substrate 36. In some embodiments, once a sacrificial layer 46 of an LED source wafer 40 is etched to form a gap 46, an LED structure 30 can be micro-transfer printed by pressing a stamp against the LED structure 30 to break one or more LED tethers 38 that connect the LED structure 30 to anchors 44 of an LED substrate 42 of the LED source wafer 40 and adhere the LED structure 30 to the stamp. The LED structure 30 is then conveyed to a component substrate 20 and adhered to the component substrate 20 (e.g., micro-transfer printed onto the component substrate 20).

An optical element 50 can have an optical element extent $D_{Optic}$ over a component substrate 20 (as shown in FIG. 1A). An optical element extent $D_{Optic}$ can be an area of an optical element 50 over a component substrate 20 (i.e., the area defined by a projection of the optical element 50 orthogonally onto the component substrate 20), a diameter, or a dimension of the optical element 50 in a direction parallel to the component substrate 20. Similarly, an LED structure 30 can have an LED structure extent $D_{LED}$ over a component substrate 20 (as shown in FIGS. 1A, 2). An LED structure extent $D_{LED}$ can be an area of an LED structure 30 over a component substrate 20, an area of an LED 32 of the LED structure 30 over the component substrate 20, or an area $D_{LEA}$ of a light-emitting volume 33 of the LED 32 over the component substrate 20 (i.e., the area defined by a projection orthogonally onto the component substrate 20). An LED structure extent $D_{LED}$ can be limited to an area encompassing only an LED structure 30, LED 32 of the LED structure 30, or LED light-emitting area $D_{LEA}$ of one or more LEDs 32, for example a convex hull surrounding the LED structure 30, the LED 32, or LED light-emitting area $D_{LEA}$ of one or more LEDs 32. In some embodiments, wherein an LED optical component 10 comprises multiple LED structures 30 (e.g., each comprising multiple LEDs 32), an LED structure extent $D_{LED}$ can be an area, for example a convex hull, encompassing all of the multiple LED structures 30, all of the multiple LEDs 32 (e.g., in one or multiple LED structures 30), or an LED light-emitting area $D_{LEA}$ of the LEDs 32 (e.g., of one or more multiple LED structures 30).

In various embodiments of the present invention, an optical element 50 comprises at least one of one or more refractive lenses, a dichroic filter, a color filter, a reflector, a diffuser, a polarizer, a wire-grid polarizer, a diffraction grating, and a diffractor. An optical element 50 can be a reflective element located on an LED side 22 of a component substrate 20, with the LED 32 located between a portion of the optical element 50 and the LED side 22. In some embodiments, a reflector 23 is disposed between an LED structure 30 (e.g., an LED 32 of the LED structure 30) and the LED side 22 of a component substrate 20 (as shown in FIG. 1B) except where the LED 32 emits light into or onto an optical element 50. A reflector 23 can be substantially unpatterned (as shown in FIG. 1B) or patterned (not shown).

In some embodiments in which an optical element 50 is a reflective optical element 50 (such as those shown in FIGS. 1A and 1C), the reflective optical element 50 can be substantially parabolic, substantially spherical, substantially ellipsoidal, or can form a polygon with the component substrate 20. By substantially it is meant that the structure conforms to the desired shape within the limitations of a manufacturing process. If an optical element 50 has a focal point, at least a portion of the LED light-emitting area $D_{LEA}$, LED light-emitting volume 33, LED 32, or LED structure 30 can be disposed at the focal point of the optical element 50.

Figure 3:
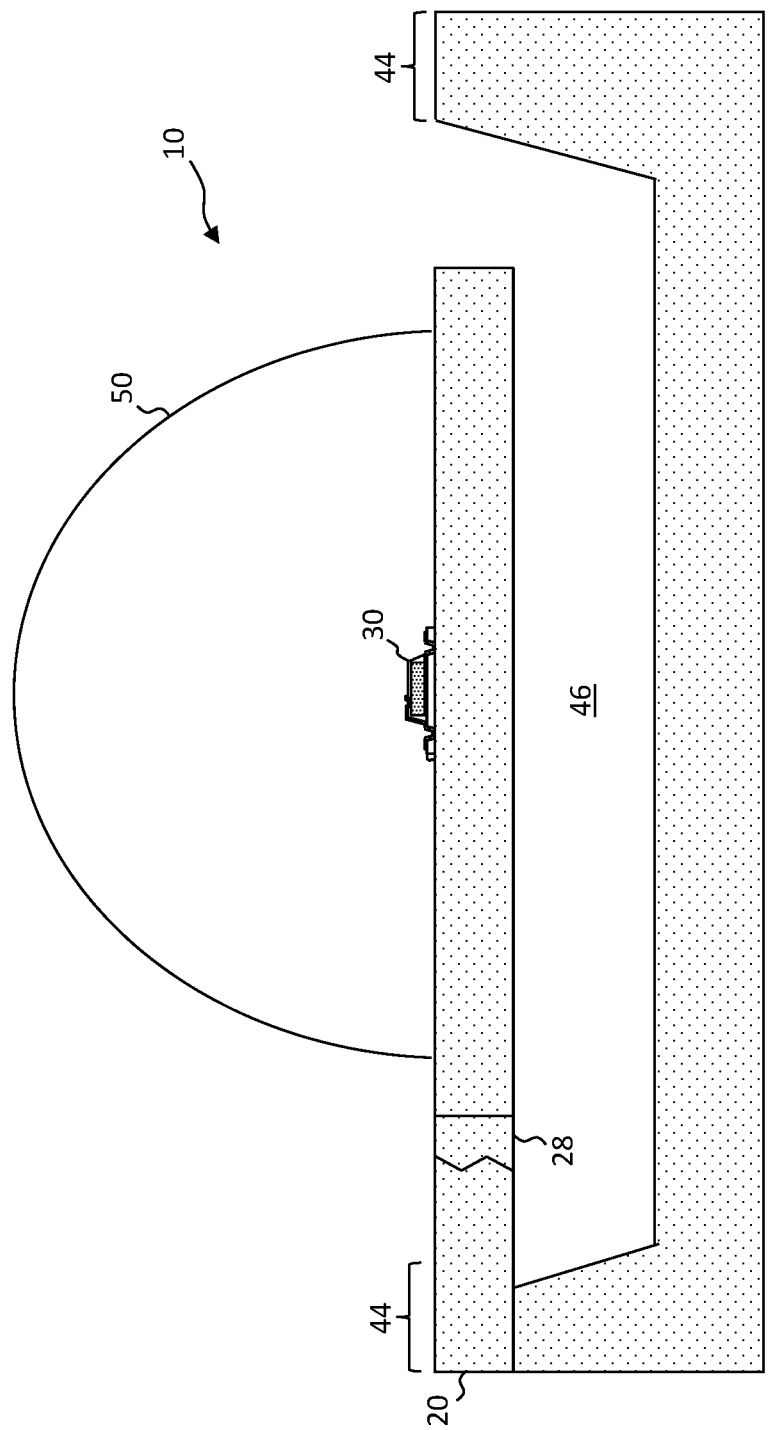
FIG. 3 is a cross section of a transfer-printable LED optical component according to illustrative embodiments of the present invention.

Referring to FIG. 3, an LED optical component 10 can be a transfer printable structure (e.g., a micro-transfer printable structure) formed on a component wafer with a component substrate 20 over a patterned sacrificial layer 46 that can be etched to form a gap 46 such that the component substrate 20 is attached to one or more anchors 44 (e.g., portion(s) of the component wafer) with one or more component tethers 28. An LED structure 30 can be transfer printed (e.g., micro-transfer printed from an LED source wafer 40, as shown in FIG. 2) onto the component substrate 20 and, in some embodiments, an optical element 50 is provided over the LED structure 30 and at least a portion of the component substrate 20. In some embodiments, an optical element is transfer printed (e.g., micro-transfer printed) in order to form an LED optical component such that the optical element comprises one or more broken or separated element tethers after printing. The LED optical component 10 can then be transfer printed (e.g., micro-transfer printed) to a desired structure by contacting the LED optical component 10 with a stamp to break the one or more component tethers 28. In some embodiments, an optical element 50 is formed or disposed on the desired structure after a component substrate 20 with an LED structure 30 disposed thereon is transfer printed (e.g., micro-transfer printed) to the desired location (e.g., substrate).

Figure 4:
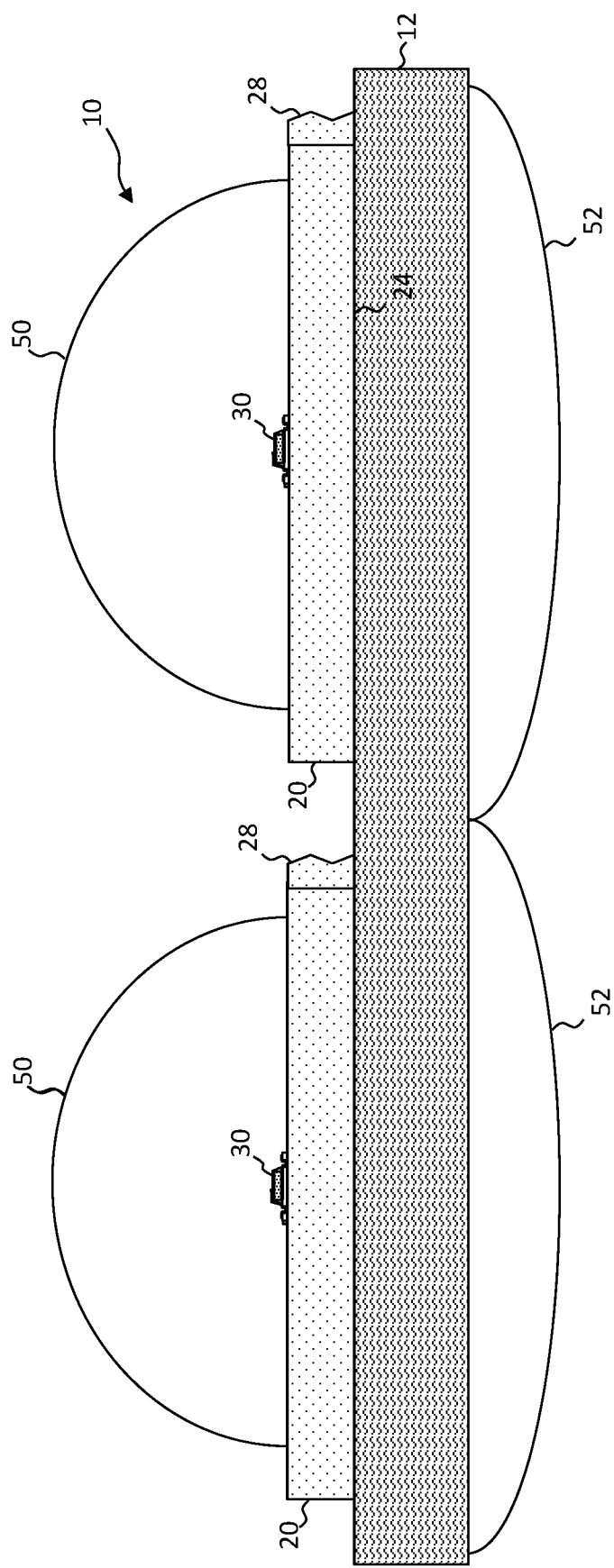
FIG. 4 is a cross section of a plurality of LED optical components disposed on a system substrate with a second optical element disposed on the system substrate, according to illustrative embodiments of the present invention.

Referring to FIG. 4, in some embodiments of the present invention, an optical element 50 is a first optical element 50 and an LED optical component 10 comprises a second optical element 52 disposed between an LED structure 30 and a component substrate 20 of the LED optical component 10 or disposed on the side 24 of the component substrate 20 opposite the LED structure 30. FIG. 4 illustrates a system substrate 12 supporting a plurality of LED optical components 10 each comprising a second optical element 52 in contact with the side of the system substrate 12 opposite the side on which the component substrate 20 is disposed. In some embodiments, second optical elements 52 are in contact with opposite side 24 of the component substrate 20, for example similarly to the optical elements 50 of FIGS. 1B and 1C. The second optical element 52 can comprise at least one of one or more refractive lenses (as shown in FIG. 4), a dichroic filter, a color filter, a reflector, a diffuser, a polarizer, a wire-grid polarizer, a diffraction grating, and a diffractor. As shown in FIG. 4, in some embodiments, a second optical element 52 is disposed (e.g., formed) on a side of the system substrate 12 opposite a component substrate 20, broken component tether 28, LED structure 30, and first optical element 50.

FIGS. 1A and 2 illustrate embodiments in which an LED 32 is a top-emitter LED 32 that emits light towards and incident on an optical element 50 and comprises a bottom electrode 34 and one or more LED contact pads 35 (which can be the same element and can be reflective). In FIGS. 1B and 1C, LEDs 32 are bottom-emitter LEDs 32 that emit light towards (e.g., into) component substrates 20 and each LED structure 30 comprises electrodes 34 and one or more LED contacts 35 (that can be reflective) on the same side of the LEDs 32 that is opposite the component substrate 20 (e.g., as shown in the LED structure 30 shown in FIG. 5). In some embodiments, portions of a bottom electrode 34 contacting a bottom side of a bottom-emitting LED 32 can be transparent. In FIG. 1A, the LED structure 30 is at least partly between the optical element 50 and the component substrate 20. In FIGS. 1B and 1C, the component substrates 20 are at least partly between the optical elements 50 and the LED structures 30.

In some embodiments, an optical element 50 is disposed between an LED structure 30 and a component substrate 20. Referring to FIG. 5, for example, in some embodiments, an optical element 50 is a dichroic filter comprising alternating layers of optical materials with different optical refractive indices. Light 60 emitted from the bottom-emitting LED 32 of the LED structure 30 shown in FIG. 5 passes through the dichroic filter (optical element 50) and the component substrate 20 of the LED structure 30 and thence into the environment. An optical element 50 can be formed as an unpatterned layer on a component substrate 20 and can be distinct from an LED substrate 36 or LED 32. An LED structure 30 can be transfer printed (e.g., micro-transfer printed) onto an optical element 50.

Figure 6:
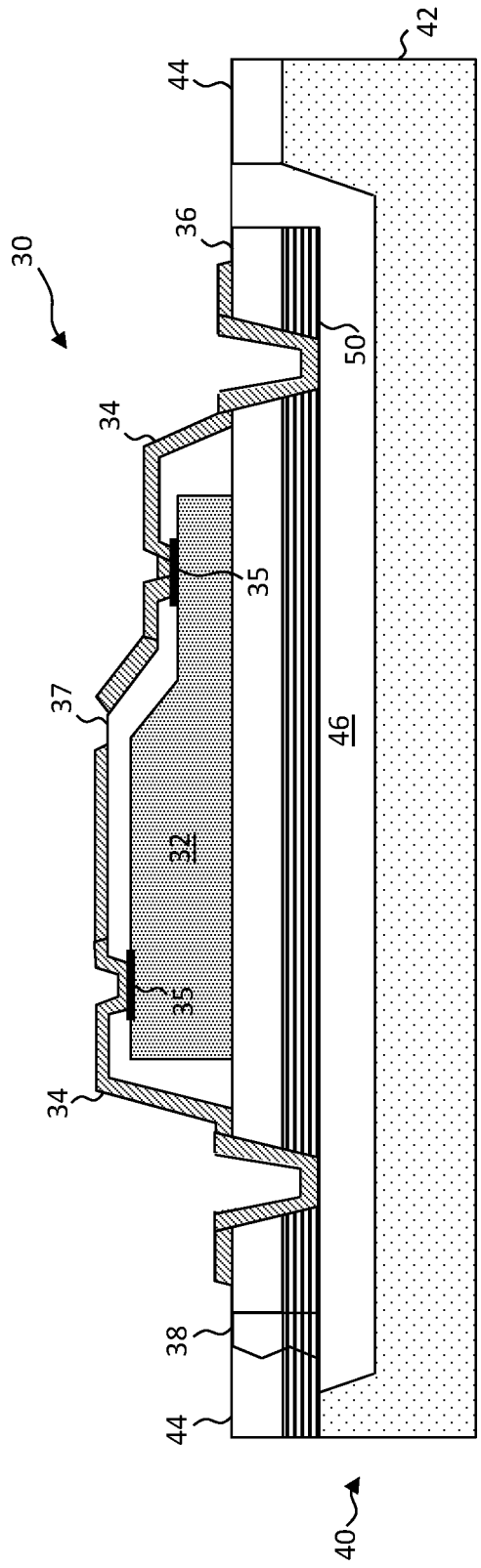
FIGS. 6 and 7 are cross sections of different transfer-printable LED optical components with dichroic filter optical elements, according to illustrative embodiments of the present invention.
Figure 7:
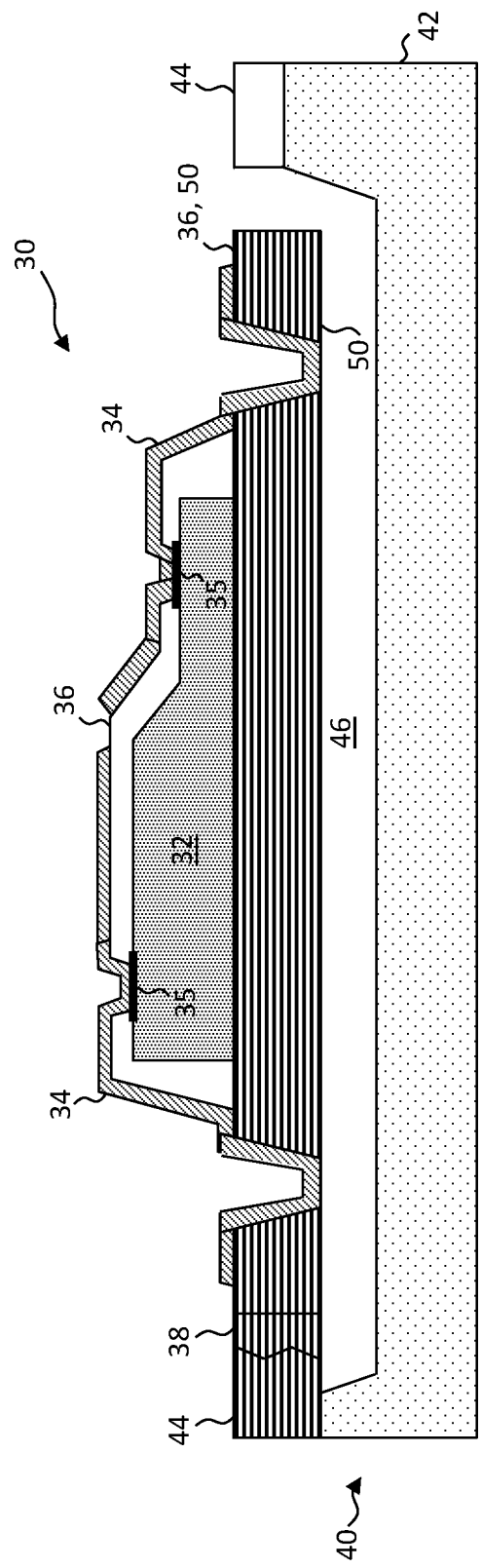

In some embodiments, and as shown in FIGS. 6 and 7, an optical element 50 is formed over an LED source substrate 42 of an LED source wafer 40. In FIG. 6, LED substrate 36 is then formed over optical element 50 (i.e., a dichroic filter). In some embodiments, an optical element 50 (e.g., a dichroic filter) is formed over an LED substrate 36 and disposed between an LED 32 and the LED substrate 36. In some embodiments, an LED 32 is formed directly on an optical element 50 so that the optical element 50 filter is an LED substrate 36 (for example, as shown in FIG. 7). In some embodiments, an LED 32, patterned electrodes 34, LED contact pads 35, and patterned dielectric layer 37 are disposed over an LED substrate 36 (e.g., as described with respect to FIG. 2). In some embodiments, a sacrificial layer 46 is etched to form a gap 46 so that an LED structure 30 is attached to one or more anchors 44 of an LED source wafer 40 (e.g., one or more portions of LED source substrate 42) with one or more LED tethers 38. In some embodiments, a tether 38 is broken (e.g., fractured) or separated when an LED structure 30 is transfer printed (e.g., micro-transfer printed), with an optical element 50, onto a component substrate 20. Thus, in some embodiments of an LED optical component 10, an optical element 50 is only present in correspondence to (e.g., in a volume adjacent to or provided with, or both in a volume adjacent to and provided with) an LED structure 30.

Figure 8:
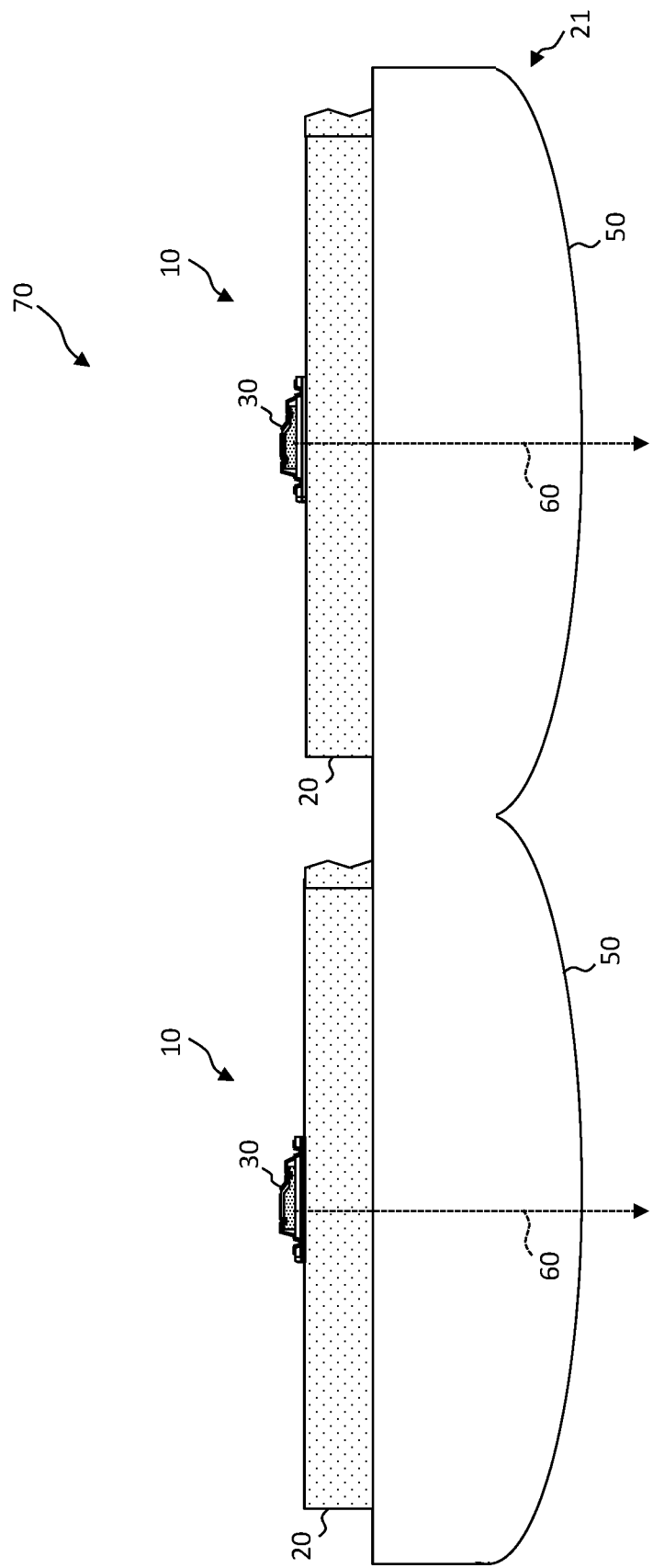
FIG. 8 is a cross section of multiple LED optical components comprising multiple optical elements, according to illustrative embodiments of the present invention.

In some embodiments, an LED optical system 70 comprises a plurality of optical components 10 and a corresponding plurality of LED structures 30 and optical elements 10. For example, an LED optical system 70 according to FIG. 8 comprises a plurality of the structures illustrated in FIG. 6 or FIG. 7 disposed on each component substrate 20. In such an example, each LED structure 30 emits light directly through the optical element 50 filter (as shown in FIG. 6 or FIG. 7) into a component substrate 20 and then into a corresponding optical element 50. Component substrates 20 can be distinct from optical elements 50 and second optical elements 52 (as shown in FIG. 8). Component substrates 20 and LED structures 30 can be disposed on a single optical structure 21 that comprises multiple optical elements 50 (e.g., each LED optical component 10 comprising a different optical element 50). Component substrates 20 with LED structures 30, and optionally, optical elements 50, can be transfer printed (e.g., micro-transfer printed) onto an optical structure 21 such that each component substrate 20 comprises a broken or separated component tether 28. In some embodiments, optical elements 50 are integral with a component substrate 20 in a common optical structure (not shown) and all of the LED structures 30 and component substrates 20 are disposed on a single optical structure 21 that includes multiple optical elements 50. In other embodiments, all of the LED structures 30 are disposed on a single common component substrate 20 (not shown but e.g., similarly to optical elements 50 in FIGS. 1B and 1C).

Figure 9:
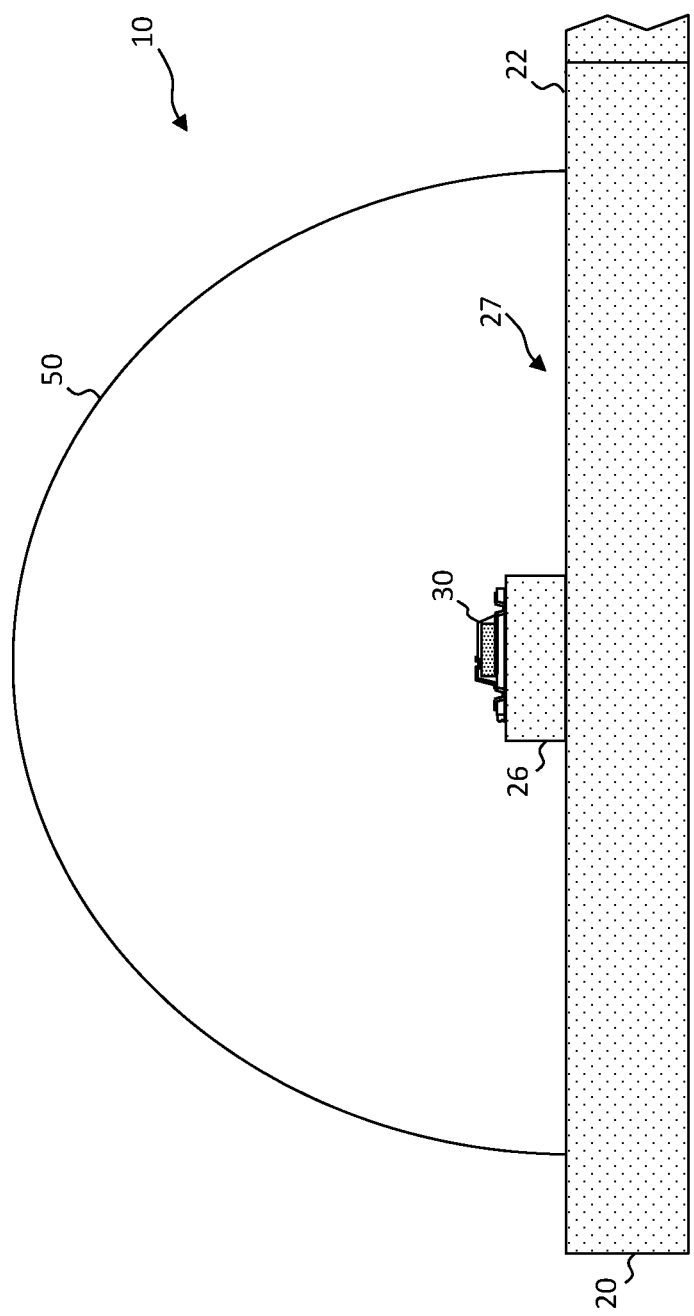
FIG. 9 is a cross section of an LED optical component that includes a component substrate with a pedestal portion on which an LED structure is disposed, according to illustrative embodiments of the present invention.

In some embodiments of an LED optical component 10, and as shown in FIG. 9, a component substrate 20 is non-planar and comprises a pedestal portion 26 and a non-pedestal portion 27, both on the LED side 22. The pedestal portion 26 extends (e.g., vertically) from the non-pedestal portion 27. In such embodiments, an LED structure 30 comprising an LED 32 is disposed on the pedestal portion 26. In some embodiments, an optical element 50 is formed or disposed over both the pedestal and non-pedestal portions 26, 27 of a component substrate 20 such that the optical element 50 is located on the LED side 22, with the LED structure 30 and LED 32 located between a portion of the optical element 50 and the LED side 22. In some embodiments, an optical element 50 extends onto the non-pedestal portion 27 of a component substrate 20. An arrangement comprising a component substrate 20 comprising a pedestal portion 26 can more readily dispose an LED 32 or light-emitting volume 33 of the LED 32 at the focal point, focal area, or focal volume of an optical element 50.

In various embodiments of the present invention, an LED optical component 10 emits at least one of collimated light, light having a Lambertian distribution, light focused to a point or desired volume, light that focuses to a volume smaller than an LED structure 30 or LED 32 of the LED optical component 10, and light that focuses to a volume smaller than a light-emitting volume 33 or LED light-emission area $D_{LEA}$ of an LED 32 over a component substrate 20 of the LED optical component 10 (e.g., as illustrated in FIG. 2).

In some embodiments, an LED structure 30 or LED 32 has at least one of a length, width, and depth less than or equal to one micron, two microns, three microns, five microns, ten microns, twenty microns, fifty microns, one hundred microns, or two hundred microns. An LED 32 can have a light-emitting volume 33 and corresponding LED light-emission area $D_{LEA}$ of the LED 32 over a component substrate 20 on which the LED 32 is disposed. An optical element 50 can have an extent over a component substrate 20 that is at least three times greater, five times greater, ten times greater, twenty times greater, or fifty times greater than a light-emitting volume 33 or an LED light-emission area $D_{LEA}$ of an LED 32, an LED 32 itself, or an LED structure 30.

Figure 10:
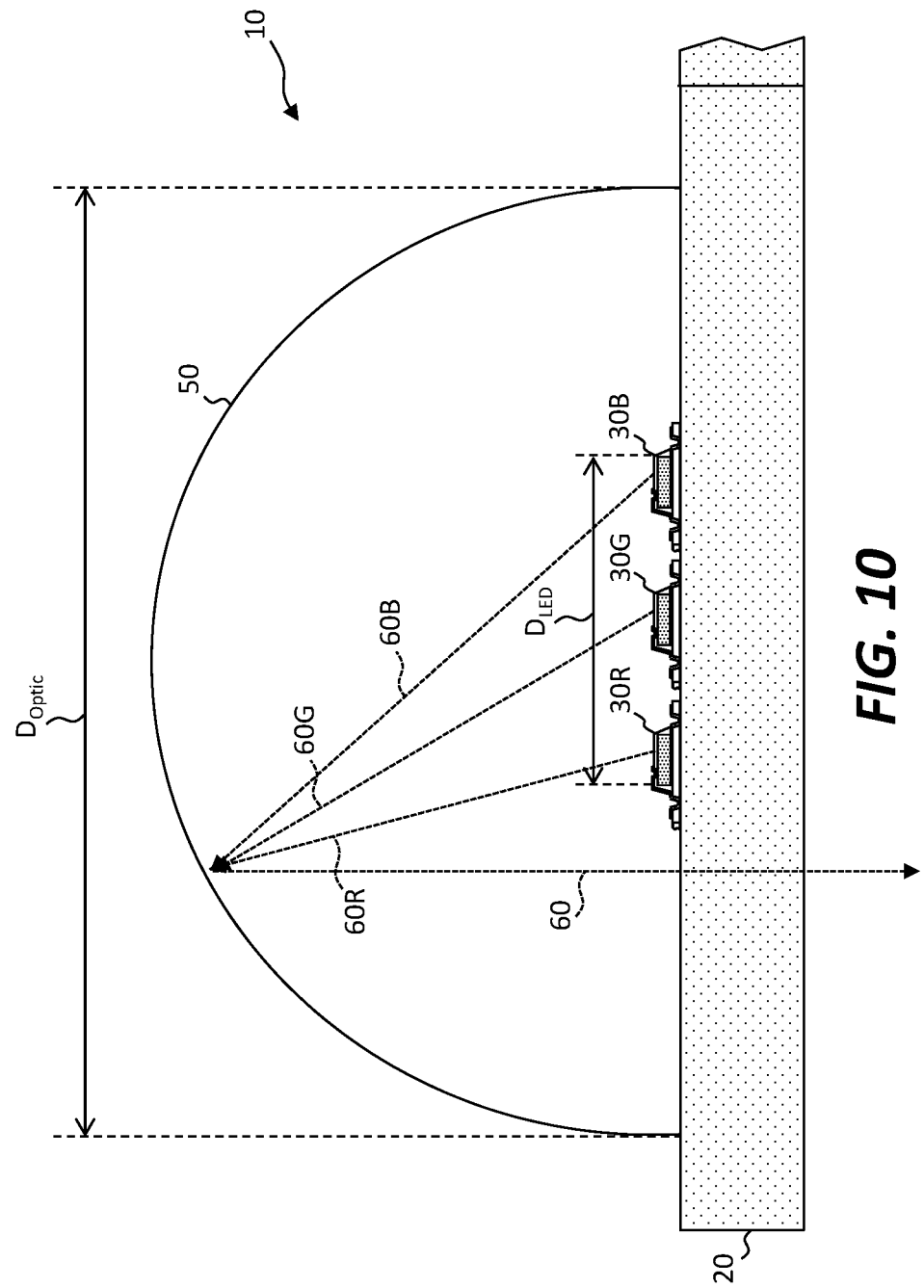
FIG. 10 is a cross section of an optical component including multiple LED structures that emit light of different colors incident on a common optical element, according to illustrative embodiments of the present invention.
Figure 11:
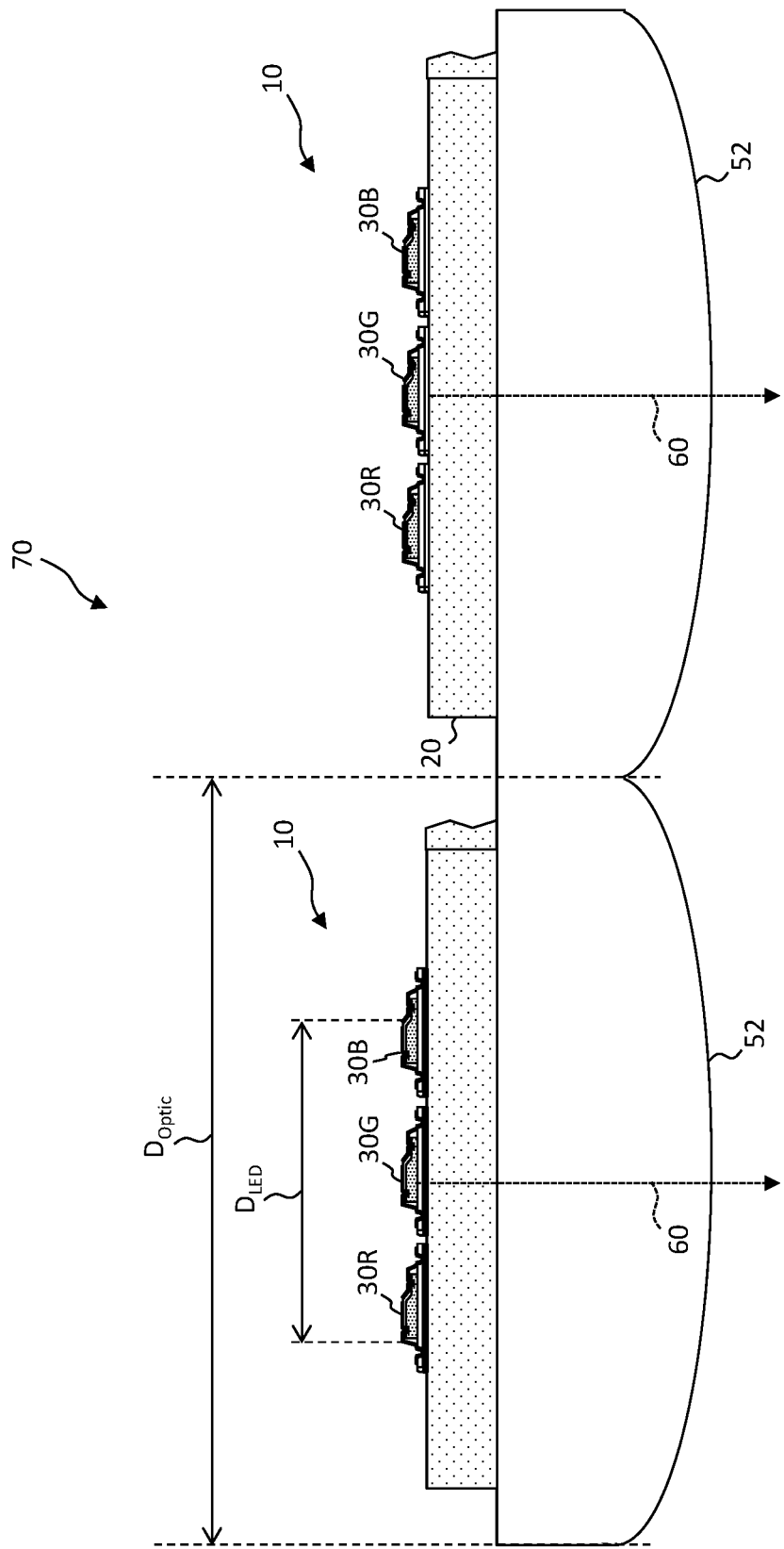
FIG. 11 is a cross section of a plurality of LED optical components, each including multiple LED structures that emit light of different colors incident on a common optical element, according to illustrative embodiments of the present invention.

Referring to FIGS. 10 and 11, in an LED optical component 10 in accordance with some embodiments of the present invention, an LED structure 30 is a first LED structure 30R comprising an LED 32 that emits a first color of light 60R (for example red light) from the LED 32 and the LED optical component 10 includes a second LED structure 30G comprising an LED 32 that emits a second color of light 60G different from the first color (for example green light) from the LED 32. In some embodiments, an LED optical component 10 includes a third LED structure 30B comprising an LED 32 that emits a third color of light 60B different from the first color and different from the second color (for example blue) from the LED 32. Any of the first, second, and third LED structures 30R, 30G, 30B are collectively referred to as LED structures 30 and any of the first, second, and third LEDs 32R, 32G, 32B are collectively referred to as LEDs 32. In some embodiments, light emitted from different LEDs is incident on the same or different optical elements.

In some embodiments, because first, second, and third LED structures 30R, 30G, 30B are relatively small compared to an optical element 50, for example, as determined by a ratio of an LED structure extent $D_{LED}$ (e.g., taken as a convex hull of LED structures 30R, 30G, and 30B in FIG. 10) to the extent $D_{Optic}$ of the optical element 50 over the component substrate 20, the LED structures 30 can substantially appear to be a single point source of light (e.g., with uniform color, for example white light 60 as viewed by the human visual system). Such point sources are useful to provide color mixing in illumination systems (e.g., lamps) or in displays. Thus, in various embodiments, an optical element 50 has an extent over a component substrate 20 that is at least three times greater, five times greater, ten times greater, twenty times greater, or fifty times greater than an extent of light emitted from the LEDs 32 of first and second LED structures 30R, 30G or from the LEDs 32 of first, second and third LED structures 30R, 30G, 30B.

In FIG. 10, the first, second, and third LED structures 30R, 30G, 30B emit red, green, and blue light 60R, 60G, 60B directly into or onto a reflective optical element 50. In FIG. 11, an LED optical system 70 comprises a first optical element 50 for each of the first, second, and third LED structures 30R, 30G, 30B in an LED optical component 10 (e.g., in accordance with structures shown in FIG. 6 or 7). In some embodiments, each of the LED structures 30R, 30G, 30B has a corresponding respective first optical element 50 tuned to filter emitted light to the desired frequency of the corresponding LED 32, providing a purer color having a reduced full-width half-max spectral range for light emitted from each of the different LEDs 32 (e.g., as individually shown in FIGS. 6 and 7). A second optical element 52 can be provided to further direct the light emitted from the different LED structures 30.

In some embodiments, a second optical element 52 is common to the first and second LED structures 30R, 30G, for example disposed on a common component substrate 20. In some embodiments, a second optical element 52 is common to the first, second, and third LED structures 30R, 30G, 30B disposed on a common component substrate 20 (e.g., as shown in FIG. 11). Thus, in some embodiments of the present invention, an LED optical component 10 comprises a first optical element 50 disposed such that emitted light (i.e., light emitted from the first LED 32) is incident on the first optical element 50 and the LED optical component 10 includes a second optical element 52 disposed at least partly in contact with the component substrate 20 such that the emitted light from the second LED 32 is incident on the second optical element 52. The second optical element 52 is a refractive optical element 52 in FIG. 11 but could be, as a non-limiting alternative, a reflective optical element 52, for example as illustrated in FIG. 1C.

In some embodiments of the present invention, each LED structure 30 has emits light through a common second optical element 52. In some embodiments, an LED optical component 10 comprises a corresponding second optical element 52 for each LED structure 30. For example, the second optical element 52 corresponding to a first LED structure 30R could be a red-light filter, the second optical element 52 corresponding to a second LED structure 30G could be a green-light filter, and the second optical element 52 corresponding to a third LED structure 30B could be a blue-light filter. In some embodiments, a first optical element 50 or a second optical element 52 is common to first and second LED structures 30R, 30G. In some embodiments, a first optical element 50 or a second optical element 52 is common to first, second, and third LED structures 30R, 30G, 30B. In other embodiments, each of the first and second optical elements 50, 52 or both intercept light emitted from any one, any combination, or all of the LED structures 30 or LEDs 32. As intended herein, color filters include color-change materials such as down-converting phosphors or quantum dots.

Use of different first and second optical elements 50, 52 can provide the light 60 emitted by the different first and second LED structures with different attributes, for example different colors or different polarizations or both. In an exemplary embodiment, an array of LED optical components 10 with a common polarization provides a back light for a liquid crystal display (LCD). Thus, in various embodiments, the present invention provides microscopic light sources with desirable attributes such as a narrow spectral range, collimated light, or polarized light.

Figure 12:
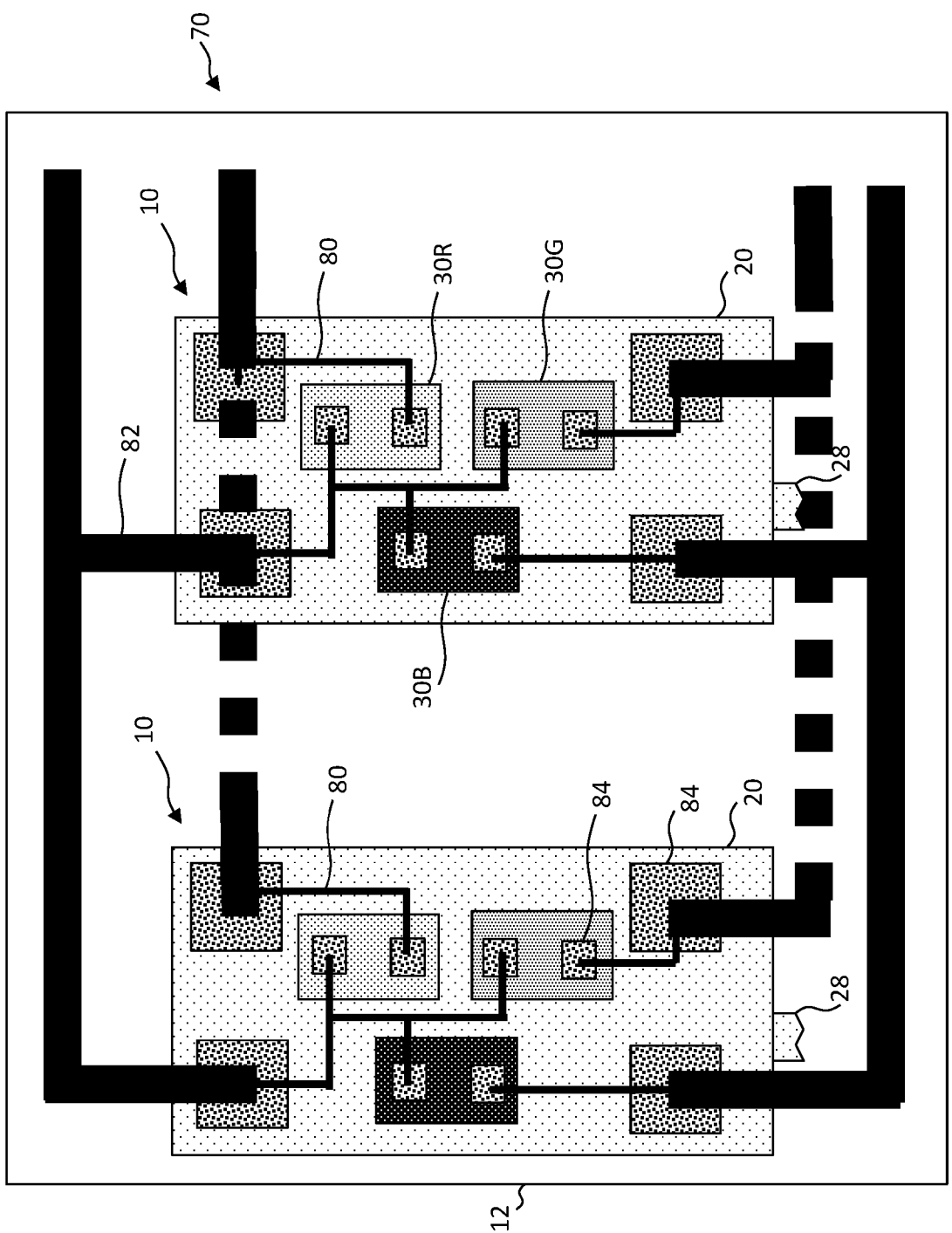
FIG. 12 is a plan view of multiple LED structures, each having multiple LEDs, disposed on a system substrate, according to illustrative embodiments of the present invention.

In some embodiments of the present invention, and referring to FIG. 12 (and FIG. 4 in cross section), an LED optical system 70 includes a system substrate 12 on which one or more LED structure 30 or LED optical components 10 are disposed. As shown in FIG. 12, red-, green-, and blue-light emitting first, second, and third LED structures 30R, 30G, 30B are disposed on component substrates 20 that are disposed onto the system substrate 12. The LEDs 32 of the first, second, and third LED structures 30R, 30G, 30B are electrically connected with fine-resolution electrical connections 80 (for example formed by photolithographic techniques and having dimensions from 100 nm to 1 micron, from 1 micron to 10 microns, from 10 microns to 50 microns, or from 50 microns to 100 microns) to component contact pads 84 to form pixel modules, each comprising an electrically connected LED optical component 10. Wires indicated by dashed lines are formed in a lower layer to avoid shorting and are connected to wires 80 in an upper layer (e.g., through vias). LED optical components 10 can be transfer printed (e.g., micro-transfer printed) onto a system substrate 12 and electrically connected using relatively low-cost (compared to the fine-resolution electrical connections within each LED optical component 10) coarse-resolution electrical connections 82 (for example formed by printed-circuit board (PCB) or screen-printing techniques and having dimensions from 100 microns to 1 mm, or from 1 mm to 10 mm. Thus, in some embodiments, as shown in FIG. 12, LED structures 30 are electrically interconnected on a component substrate 20 with fine-resolution electrical connections 80 and component substrates 20 are electrically interconnected on a system substrate 12 with coarse-resolution electrical connections 82, thereby reducing costs (e.g., by reducing the amount of relatively expensive fine-resolution electrical connections 82 used to form interconnections). Fine-resolution electrical connections or wires 89 are smaller and have a greater resolution than the coarse-resolution electrical connections 82 so that more electrically separate fine-resolution wires 80 can be formed in a given area than coarse-resolution wires 82.

In some embodiments, a system substrate 12 comprises an optical element that redirects light emitted into the system substrate 12. In some embodiments, an optical element 50 is disposed on a system substrate 12 that redirects light emitted into or onto the optical element 50, for example lenses or reflectors.

In some embodiments, a light-emitting diode (LED) optical component 10 includes an optical element 50 having an optical substrate, the optical element 50 having an optical extent and an optical area. An LED structure 30 comprises a broken LED tether 38 and an LED 32 separate from the optical substrate. The LED structure 30 is disposed on a component substrate 20 and the LED 32 emits light into or onto the optical element 50 when provided with electrical power. The LED structure 30 has an LED extent and a light-emitting area. In some embodiments, the optical extent is at least one thousand, five thousand, ten thousand, fifty thousand, one hundred thousand, five hundred thousand, or one million times the LED extent. In some embodiments, the optical area is at least one hundred thousand, five hundred thousand, one million, five million, ten million, or fifty million times the LED area.

Figure 14:
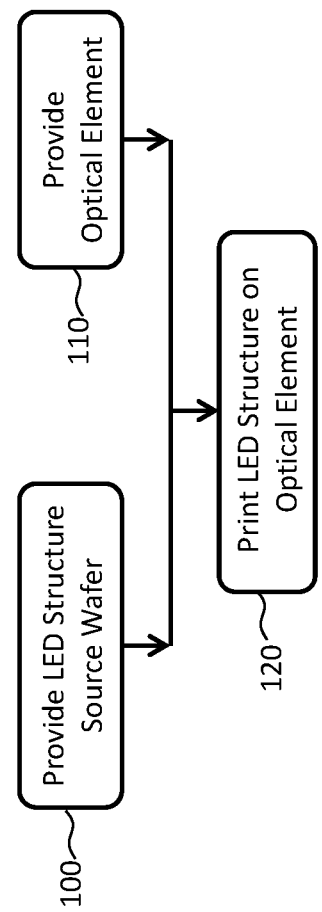
FIGS. 14 and 15 are flow diagrams illustrating exemplary methods in accordance with illustrative embodiments of the present invention.

Referring to FIG. 14, a method of making an LED optical component 10 includes providing an LED source wafer 40 having LED structures 30 disposed on a sacrificial layer 46 in step 100, for example by using photolithographic methods, materials, and processes. An optical element 50 is provided in step 110 and, in step 120 an LED structure 30 is micro-transfer printed onto the optical element 50 by etching the sacrificial layer 46 of the LED source wafer 40, pressing a micro-transfer stamp against the LED structure 30 to break the one or more LED tethers 38 (connecting the LED structure 30 to the LED source wafer 40) and adhere the LED structure 30 to the stamp, transferring the stamp and the LED structure 30 to the optical element 50, and contacting the LED structure 30 to the optical element 50 to adhere the LED structure 30 to the optical element 50.

Figure 15:
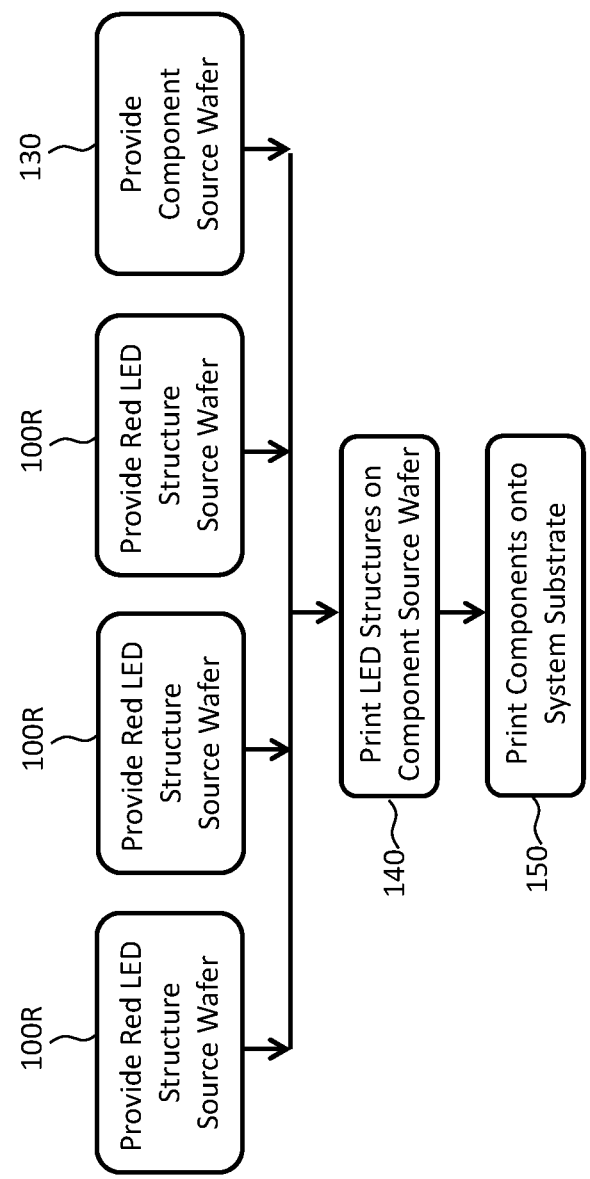

Referring to FIG. 15, a method of making an LED optical component 10 includes providing red, green, and blue LED source wafers 40 having first, second, and third LED structures 30R, 30G, 30B comprising red-light-emitting LEDs 32, green-light-emitting LEDs 32, and blue-light-emitting LEDs 32 (respectively), disposed on a sacrificial layer 46 on the respective red, green, and blue LED source wafers 40 in steps 100R, 100G, and 100B. A component source wafer is provided in step 130 and the first, second, and third LED structures 30R, 30G, 30B are micro-transfer printed from their respective red, green, and blue LED source wafers 40 to the component source wafer in step 140 and electrically connected using fine lithography. In step 150, optical components 10 are micro-transfer printed to the system substrate 12 from the component source wafer and the optical components 10 are electrically connected using coarse lithography (e.g., to an external power, control signal source, or both). In some embodiments, the LED optical system 70 can then be operated by providing power or control signals to the coarse-resolution wires 82 from an external control circuit (not shown) to electrically stimulate the LEDs 32 through the fine-resolution wires 80 (e.g., using electrodes 34) to emit light 60. The light 60 passes through (e.g., is filtered or refracted) or is reflected from a first optical element 50 and optional second optical element 52 disposed onto the LED optical component 10 and provides the desired function, for example illumination or display.

In some embodiments, each LED optical component 10 is at least a portion of a pixel in a display. LED optical components 10 can be arranged or disposed in an array over a display substrate (e.g., system substrate 12) that can include at least one of glass, flexible glass, plastic, resin, ceramic, and metal. A system substrate 12 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to some embodiments of the present invention, a system substrate 12 can include layers formed on an underlying structure or substrate, for example a rigid or flexible glass or plastic substrate.

Generally, LED structures 30 and LED source wafers 40 can be made using techniques and materials found in the photolithographic and display industries, as well as the printed-circuit board industry. An LED source substrate 42 or component substrate 20 can be a semiconductor source substrate, for example silicon, such as silicon (1 0 0) or silicon (1 1 1), compound semiconductors, glass, plastic, or other materials suitable for wafers. Sacrificial layers 46 can include layers or patterned layers of etchable materials, for example such as oxides or nitrides such as silicon oxide or silicon nitride, or portions of an LED source substrate 42 or component substrate 20 that are differentially etchable in different directions (for example by taking advantage of the crystalline structure of the LED source substrate 42 or a component substrate 20 to etch in one direction more rapidly than in another direction). A system substrate 12 can be a display or lamp substrate, for example glass or plastic.

First and second optical elements 50, 52 can be made of glass or plastic and formed by molding or casting, for example injection molding or extrusion, or stamping or etching and can be provided with desirable shapes or profiles. First and second optical elements 50, 52 can, for example, have multiple layers of different materials with different attributes, such as optical refractive indices, thicknesses, or reflectivities and can, for example, be deposited by coating, sputtering, or evaporation. First and second optical elements 50, 52 can be ground or polished and can be coated with reflective materials, for example aluminum deposited by evaporation, or anti-reflection layers. First and second optical elements 50, 52 can be made by depositing layers of optically transparent materials by coating, evaporation, or sputtering. Photolithographic methods can be used to form structures such as wire-grid polarizers, diffraction gratings, or diffractors. Reflective or refractive particles can be provided in a coating or layer to form diffusers. Pigments or dyes can be used to filter light 60 and color-change materials (e.g., materials comprising phosphors or quantum dots) can change the frequency of emitted light 60. All of these optical structures or functions are contemplated for use in various embodiments of optical elements in accordance with embodiments of the present invention.

LEDs 32 can be semiconductor structures, such as silicon, or compound semiconductor structures, for example GaN. Different LEDs 32 that emit light of different colors can be made using different semiconductors, such as different compound semiconductors or different compositions of compound semiconductors. LEDs 32 can be inorganic LEDs (e.g., inorganic micro-LEDs). LED structures 30 can include dielectric materials, for example silicon dioxide or nitride to protect LEDs 32 in LED structures 30 and provide tethers (e.g., LED tether 38 or component tether 28).

LEDs 32 in accordance with some embodiments of the present invention can include an inorganic micro-light-emitting diode (micro-iLED) 32 having a light-emitting side disposed to emit light 60. In some embodiments, solid-state lasers (e.g., diode lasers such as micro-diode lasers) are used as light emitters (in place of micro-LEDs 32) in LED optical components 10. It is understood that where reference is made to an LED or micro-LED in the present disclosure, a comparably sized diode laser can be used in place of the LED or micro-LED. Micro-LEDs 32 having various structures can be made using, for example, doped or undoped semiconductor materials and can be made using photolithographic techniques. Micro-LEDs 32 can be relatively small, for example in some embodiments each micro-LED 32 has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm. In some embodiments, micro-LEDs 32 are formed in substrates or on supports separate, distinct, and independent from a system substrate 12 or component substrate 20.

Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety. In some embodiments, an LED optical component 10 is a compound micro-assembled device. Additional details useful in understanding and performing aspects of the present invention are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer includes another layer there between. Additionally, "on" can mean "on" or "in."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST $D_{Optic}$ optical element extent
$D_{LED}$ LED structure extent
$D_{LEA}$ LED light-emission area
10 LED optical component
12 system substrate
20 component substrate
21 optical structure
22 LED side
23 reflector
24 opposite side
26 pedestal portion
27 non-pedestal portion
28 component tether
30 LED structure
30R first LED structure
30G second LED structure
30B third LED structure
32 LED/micro-LED
33 light-emitting volume
34 electrode
35 LED contact pad
36 LED substrate
37 dielectric layer
38 LED tether
40 LED source wafer
42 LED source substrate 44 anchor
46 sacrificial layer/gap
50 optical element/first optical element
52 second optical element
60 light
60R red light
60G green light
60B blue light
70 LED optical system
80 fine-resolution electrical connection/wire
82 coarse-resolution electrical connection/wire
84 component contact pads
100 provide LED structure source wafer step
100R provide red LED structure source wafer step
100G provide green LED structure source wafer step
100B provide blue LED structure source wafer step
110 provide optical element step
120 print LED structure on optical element step
130 provide component source wafer step
140 print LED structures on component source wafer step
150 print components on system substrate step

What is claimed:

1. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element, wherein the optical element is a reflective element disposed on the LED side and the LED is disposed between a portion of the optical element and the LED side.

2. The LED optical component of claim 1, comprising a reflector disposed between the LED and the LED side of the component substrate.

3. The LED optical component of claim 1, wherein the reflective optical element is substantially parabolic, substantially spherical, or forms a polygon with the component substrate.

4. The LED optical component of claim 1, wherein the optical element is disposed on the LED side of the component substrate between the LED and the component substrate or the optical element is disposed on a side of the component substrate opposite the LED.

5. An LED optical system, comprising a system substrate on which one or more LED optical components are disposed, wherein each of the one or more LED optical components comprises:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the LED structure is electrically interconnected on the component substrate with fine-resolution electrical connections for each of the one or more LED optical components and each component substrate of the one or more LED optical components is electrically interconnected on the system substrate with coarse-resolution electrical connections.

6. The LED optical system of claim 5, wherein at least one of the one or more LED optical components comprises at least one of (i) a broken or separated component tether, (ii) a broken or separated LED structure tether, and (iii) a broken or separated element tether.

7. The LED optical system of claim 5, wherein the LED of each of the one or more LED optical components is a micro-LED having one or more of a length of no more than 200 microns and a width of no more than 200 microns.

8. A light-emitting diode (LED) optical component, comprising:
an optical structure, the optical structure comprising a component substrate and an optical element having an optical extent and an optical area; and
an LED structure comprising a broken or separated LED tether and an LED that is separate from the optical element, wherein (i) the LED structure is disposed on the component substrate, (ii) the LED emits light when provided with electrical power such that at least a portion of the emitted light is incident on the optical element, and (iii) the LED structure has an LED extent and an LED light-emitting area over the component substrate,
wherein at least one of (i) the optical extent is at least one thousand times the LED extent and (ii) the optical area is at least one hundred thousand times the LED light-emitting area.

9. The LED optical component of claim 8, wherein the LED structure comprises an LED substrate separate, distinct, and independent of the component substrate and the LED.

10. The LED optical component of claim 8, wherein the optical element comprises at least one of one or more refractive lenses, a dichroic filter, a color filter, a reflector, a diffuser, polarizer, a wire-grid polarizer, a diffraction grating, and a diffractor.

11. The LED optical component of claim 8, wherein at least one of the length, width, and depth of the LED is less than or equal to two hundred microns.

12. The LED optical component of claim 8, wherein at least one of (i) the component substrate comprises a broken or separated component tether, (ii) the LED structure comprises a broken or separated structure tether, and (iii) the optical element comprises a broken or separated element tether.

13. The LED optical component of claim 8, wherein the LED is a micro-LED having one or more of a length of no more than 100 microns and a width of no more than 100 microns.

14. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the optical element is a first optical element and the LED structure comprises a second optical element disposed between the LED and the component substrate or on a side of the component substrate opposite the LED.

15. The LED optical component of claim 14, wherein the second optical element comprises at least one of one or more refractive lenses, a dichroic filter, a color filter, a reflector, a diffuser, polarizer, a wire-grid polarizer, a diffraction grating, and a diffractor.

16. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the optical element is integrated in, is integral with, or is a part of the component substrate or wherein the component substrate is an optical element, is a portion of an optical element, or comprises an optical element.

17. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the LED side of the component substrate is non-planar, the component substrate comprises a pedestal portion and a non-pedestal portion on the LED side, and the LED is disposed on the pedestal portion.

18. The LED optical component of claim 17, wherein the optical element is disposed on the LED side, with the LED located between a portion of the optical element and the LED side, and wherein the optical element extends onto the non-pedestal portion.

19. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the optical element has a focal point, the LED has a light-emitting area, and at least a portion of at least one of the light-emitting area, the LED, and the LED structure is located at the focal point.

20. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element wherein the LED optical component emits at least one of collimated light, light having a Lambertian distribution, light that focuses to a volume smaller than the LED, and light that focuses to a volume smaller than a light-emitting volume of the LED.

21. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the LED has a light-emitting area and the optical element has an extent over the component substrate that is at least three times greater than at least one of the light-emitting area of the LED, the LED itself, or the LED structure.

22. A light-emitting diode (LED) optical component, comprising:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and
an optical element disposed at least partly in contact with the component substrate such that at least a portion of the emitted light is incident on the optical element,
wherein the LED is a first LED that emits light of a first color, and the LED optical component comprises a second LED that emits light of a second color from the second LED, wherein the second color of light is different from the first color of light.

23. The LED optical component of claim 22, comprising a third LED that emits light of a third color, wherein the third color of light is different from the first color and different from the second color.

24. The LED optical component of claim 22, wherein the optical element has an extent over the component substrate that is at least three times greater than an extent of light emitted from the first LED and from the second LED.

25. The LED optical component of claim 22, wherein the optical element is a first optical element disposed such that at least a portion of the emitted light from the first LED is incident on the first optical element and the LED optical component comprises a second optical element disposed at least partly in contact with the component substrate such that at least a portion of the emitted light from the second LED is incident on the second optical element.

26. The LED optical component of claim 25, wherein the first optical element of the first LED is different from the second optical element of the second LED.

27. A light-emitting diode (LED) optical system, comprising a system substrate on which one or more LED optical components are disposed, wherein each of the one or more LED optical components comprises:
a component substrate having an LED side;
an LED structure disposed on, or adjacent to, the LED side of the component substrate, wherein (i) the LED structure comprises an LED and a broken or separated LED tether and (ii) the LED emits light from the LED when provided with electrical power; and an optical element disposed at least partly in contact with the component substrate such that at least a portion of the emitted light is incident on the optical element, wherein the system substrate is an optical element that redirects light incident on the system substrate.

28. A light-emitting diode (LED) optical system, comprising a system substrate on which one or more LED optical components are disposed, wherein each of the one or more LED optical components comprises:

a component substrate having an LED side;

an LED structure disposed on, or adjacent to, the LED side of the component substrate, wherein (i) the LED structure comprises an LED and a broken or separated LED tether and (ii) the LED emits light from the LED when provided with electrical power;

an optical element disposed at least partly in contact with the component substrate such that at least a portion of the emitted light is incident on the optical element; and comprising a second optical element disposed on a first side of the system substrate opposite a second side of the system substrate on which the one or more LED optical components are disposed.

\* \* \* \* \*

UNITED STATES PATENT AND TRADEMARK OFFICE
CERTIFICATE OF CORRECTION

PATENT NO. : 10,782,002 B2  
APPLICATION NO. : 15/796259  
DATED : September 22, 2020  
INVENTOR(S) : Christopher Bower et al.

It is certified that error appears in the above-identified patent and that said Letters Patent is hereby corrected as shown below:

On the Title Page

In the Abstract:  
Column 2, Line 2, please replace:  
"and an disposed on the component":  
With:  
--and an LED disposed on the component--

Signed and Sealed this  
Twelfth Day of January, 2021

Andrei Iancu  
*Director of the United States Patent and Trademark Office*